US008238862B2

(12) United States Patent
Mirzaei et al.

(10) Patent No.: US 8,238,862 B2
(45) Date of Patent: Aug. 7, 2012

(54) LAYOUT TECHNIQUES FOR FREQUENCY TRANSLATED FILTERS

(75) Inventors: Ahmad Mirzaei, Costa Mesa, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 534 days.

(21) Appl. No.: 12/497,317

(22) Filed: Jul. 2, 2009

(65) Prior Publication Data

US 2011/0003572 A1    Jan. 6, 2011

(51) Int. Cl.
*H04B 1/18* (2006.01)
*H04B 1/10* (2006.01)

(52) U.S. Cl. ......... 455/293; 455/307; 455/311; 455/339

(58) Field of Classification Search .................. 455/280, 455/283, 292, 293, 296, 307, 311, 334, 338, 455/339
See application file for complete search history.

(56) References Cited

U.S. PATENT DOCUMENTS

| | | | |
|---|---|---|---|
| 5,434,541 A | 7/1995 | Knoedl | |
| 5,678,226 A | 10/1997 | Li et al. | |
| 6,016,170 A | 1/2000 | Takayama et al. | |
| 6,094,236 A | 7/2000 | Abe et al. | |
| 6,141,371 A | 10/2000 | Holmes et al. | |
| 6,954,625 B2 | 10/2005 | Cowley | |
| 7,248,844 B2 | 7/2007 | Rofougaran | |
| 7,555,273 B2 | 6/2009 | Morche | |
| 7,764,942 B2* | 7/2010 | Bayruns | 455/334 |
| 7,809,349 B1* | 10/2010 | Granger-Jones et al. | 455/338 |
| 2004/0110482 A1 | 6/2004 | Chung | |
| 2007/0121945 A1 | 5/2007 | Han et al. | |
| 2007/0287403 A1 | 12/2007 | Sjoland | |
| 2008/0014896 A1 | 1/2008 | Zhuo et al. | |
| 2008/0083967 A1* | 4/2008 | Nakatani et al. | 257/534 |
| 2008/0175307 A1* | 7/2008 | Brunn et al. | 375/148 |
| 2009/0133252 A1* | 5/2009 | Drapkin et al. | 29/832 |
| 2009/0191833 A1 | 7/2009 | Kaczman et al. | |
| 2010/0255791 A1* | 10/2010 | Vazny et al. | 455/73 |
| 2010/0267354 A1* | 10/2010 | Mirzaei et al. | 455/307 |

(Continued)

FOREIGN PATENT DOCUMENTS

EP    2270982 A2    1/2011

OTHER PUBLICATIONS

Darabi, "A Blocker Filtering Technique for SAW-Less Wireless Receivers," IEEE Journal of Solid-State Circuits, vol. 42, No. 12, pp. 2766-2773, Dec. 2007.
Mirzaei et al., "A Low-Power WCDMA Transmitter With an Integrated Notch Filter," IEEE Journal of Solid-State Circuits, vol. 43, No. 12, pp. 2868-2881, Dec. 2008.
Darabi, "A Blocker Filtering Technique for Wireless Receivers," International Solid-State Circuits Conference 2007, Session 4, RF Building Blocks, 4.4, pp. 84-86, Feb. 12, 2007.

*Primary Examiner* — Nguyen Vo
(74) *Attorney, Agent, or Firm* — Sterne, Kessler, Goldstein & Fox P.L.L.C.

(57) ABSTRACT

Embodiments of a SAW-less RF receiver front-end that includes a frequency translated notch filter (FTNF) are presented. An FTNF includes a passive mixer and a baseband impedance. The baseband impedance includes capacitors that form a low-Q band-stop filter. The passive mixer is configured to translate the baseband impedance to a higher frequency. The translated baseband impedance forms a high-Q notch filter and is presented at the input of the FTNF. In an embodiment, the capacitors are implemented using MOS capacitors. In another embodiment, the capacitors are partially formed from MOS capacitors and fringe capacitors. The FTNF can be fully integrated in CMOS IC technology (or others, e.g., Bipolar, BiCMOS, and SiGe) and applied in wireless receiver systems including EDGE/GSM, Wideband Code Division Multiple Access (WCDMA), Bluetooth, and wireless LANs (e.g., IEEE 802.11).

31 Claims, 16 Drawing Sheets

U.S. PATENT DOCUMENTS

2010/0317308 A1* 12/2010 Mirzaei et al. ................ 455/230
2010/0317311 A1* 12/2010 Mirzaei et al. ................ 455/307
2011/0003569 A1* 1/2011 Mirzaei et al. ................ 455/209
2011/0092176 A1 4/2011 Molnar et al.

* cited by examiner

FIG. 11 (Fringe Capacitor Top View)

FIG. 12 (Fringe Capacitor Perspective View)

US 8,238,862 B2

LAYOUT TECHNIQUES FOR FREQUENCY TRANSLATED FILTERS

FIELD OF THE INVENTION

This application relates generally filters and, more specifically, to high quality factor (Q) filters.

BACKGROUND

There exist two commonly implemented front-end architectures in radio frequency (RF) receiver design; namely, the homodyne architecture and the heterodyne architecture. The homodyne architecture down-converts a desired channel directly from RF to baseband, whereas the heterodyne architecture down-converts a desired channel to one or more intermediate frequencies (IF) before down-conversion to baseband. In general, each of these front-end architectures typically employ an antenna to receive an RF signal, a band-pass filter to suppress out-of-band interferers in the received RF signal, a low noise amplifier (LNA) to provide gain to the filtered RF signal, and one or more down-conversion stages.

Each component in a receiver front-end contributes noise to the overall system. The noise of a component can be characterized by its noise factor (F), which is given by the ratio of the SNR at the input of the component to the SNR at the output of the component:

$$F_{COMPONENT} = SNR_{IN}/SNR_{OUT}$$

The noise of the overall receiver front-end increases from input to output as noise from successive components compound. In general, the overall noise factor of the receiver front-end is proportional to the sum of each component's noise factor divided by the cascaded gain of preceding components and is given by:

$$F_{Total} = F_1 + \frac{F_{2-1}-1}{A_1} + \frac{F_{3-1}-1}{A_1 A_2} + \ldots + \frac{F_{n-1}-1}{A_1 A_2 \ldots A_{n-1}}$$

where $F_n$ and $A_n$ represent the noise factor and gain of the nth component in the receiver front-end, respectively. The above equation reveals that the noise factor ($F_1$) and gain ($A_1$) of the first gain component can have a dominant effect on the overall noise factor of the receiver front-end, since the noise contributed by each successive component is diminished by the cascaded gain of the components that precede it.

To provide adequate sensitivity, therefore, it is important to keep the noise factor ($F_1$) low and the gain ($A_1$) high of the first gain component in the receiver front-end. The sensitivity of the receiver front-end determines the minimum signal level that can be detected and is limited by the overall noise factor of the receiver front-end. Thus, in typical receiver designs the first gain component in the front-end is an LNA, which can provide high gain, while contributing low noise to the overall RF receiver.

LNAs provide relatively linear gain for small signal inputs. However, for sufficiently large input signals, LNAs can exhibit non-linear behavior in the form of gain compression; that is, for sufficiently large input signals, the gain of the LNA approaches zero. LNA gain compression is a common issue confronted in RF receiver design, since large out-of-band interferers referred to as blockers can accompany a comparatively weak desired signal in a received RF signal. For example, in the Global System for Mobile Communications (GSM) standard, a desired signal 3 dB above sensitivity (−102 dBm) can be accompanied by a 0 dBm blocker as close as 80 MHz away. If these large out-of-band interferers are not attenuated prior to reaching the LNA, they can reduce the average gain of the LNA. As noted above, a reduction in the gain provided by the LNA leads to an increase in the noise factor of the receiver front-end and a corresponding degradation in sensitivity.

Therefore, a band-pass filter is conventionally employed in the receiver front-end, before the LNA, to attenuate large out-of-band interferers. These filters are typically mechanically-resonant devices, such as surface acoustic wave (SAW) filters, that provide a high quality factor (Q) required by many of today's communication standards (e.g., GSM). The Q-factor of a tuned circuit, such as a band-pass filter, is the ratio of its resonant frequency (or center frequency) to its 3 dB frequency bandwidth. SAW filters are generally not amenable to monolithic integration on a semiconductor substrate with the RF receiver. However, SAW filters remain conventional in RF receiver design because of the limited Q-factor of silicon-based inductors.

Although SAW filters can provide excellent attenuation of large out-of-band interferers and accurate pass-band location, they have several associated disadvantages. First, these filters have an approximate insertion loss of 1-2 dB in their pass-band. This directly adds to the noise factor and degrades sensitivity of the RF receiver. Second, these filters invariably add cost and circuit board area, especially in multi-band applications where several of these filters can be required.

Therefore, there exists a need for an apparatus that provides adequate attenuation of large out-of-band interferers on a semiconductor substrate, while minimizing area requirements.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. SAW-Less Rf Receiver Front-End

Figure 1A:
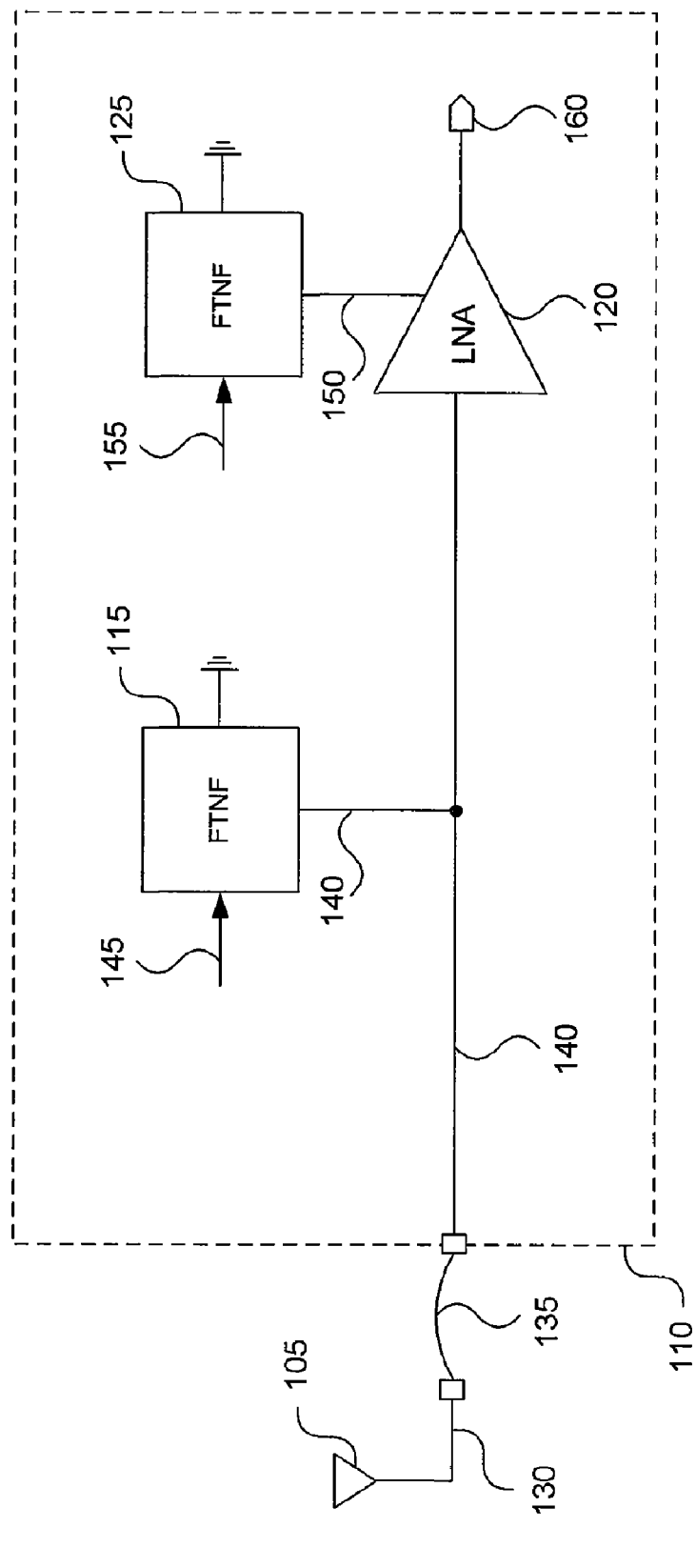
FIG. 1A illustrates an exemplary RF receiver front-end that provides for suppression of out-of-band interferers on a semiconductor substrate, according to embodiments of the present invention.

FIG. 1A illustrates an exemplary RF receiver front-end 100 that provides for suppression of out-of-band interferers on a semiconductor substrate, according to embodiments of the present invention. RF receiver front-end 100 includes an antenna 105, a semiconductor substrate 110, a first frequency translated notch filter (FTNF) 115, a low noise amplifier (LNA) 120, and a second FTNF 125.

RF receiver front-end 100 receives at antenna 105 an RF signal that includes a desired channel. In an embodiment, the desired channel is positioned within a frequency band defined by a particular communications standard. For example, the desired channel can be positioned within a frequency band defined by the GSM standard, such as the Global System for Mobile Communications 900 (GSM-900) band, the Digital Cellular System 1800 (DCS-1800) band, or the Personal Communications Services 1900 (PCS-1900) band. The RF signal is provided via antenna coupling 130 to bond wire 135. Bond wire 135 couples the RF signal to an input terminal or pin of semiconductor substrate 110. After reaching the input terminal of semiconductor substrate 110, the RF signal is coupled to single-ended RF signal path 140.

The RF signal is provided to FTNF 115, via single-ended RF signal path 140, to attenuate interferers outside the band containing the desired channel. FTNF 115 includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 145. The translated impedance forms a high-Q notch filter coupled between the RF signal, received via single-ended RF signal path 140, and ground.

In general, a notch filter is a band-stop filter with a narrow stop-band (the "notch" of the filter represents the stop-band). Frequency components of a signal applied at the input of the notch filter that fall within the stop-band are substantially precluded from being passed through to the filter output. All other frequency components of the signal, outside the stop-band, are substantially passed through to the filter output. As illustrated in FIG. 1, the input of FTNF 115 is coupled to single-ended RF signal path 140 and the output of FTNF 115 is coupled to ground.

The notch presented by FTNF 115 can be tuned to (i.e., centered within) either the frequency band of the RF signal that contains the desired channel or to the desired channel itself. Specifically, the 25% duty cycle LO signal received at LO coupling 145 can be adjusted to have a frequency substantially equal to either the center frequency of the band containing the desired channel or to the center frequency of the desired channel itself Moreover, the bandwidth of the notch presented by FTNF 115 can be designed to encompass either the band containing the desired channel or the desired channel itself. In this way, FTNF 115 can present a high-impedance path to ground for either the entire frequency band containing the desired channel or to the desired channel itself, and a low impedance path to ground for out-of-band interferers.

Since out-of-band interferers will not develop any substantial voltage across the impedance provided by FTNF 115, they will be attenuated and not provided to LNA 120. Frequency components within the notch of FTNF 115, however, will develop a substantial voltage across the impedance provided by FTNF 115 and, thus, will be provided to LNA 120 for further processing.

In conventional RF receiver front-ends, the RF signal is typically filtered by a high-Q RF filter (e.g., a SAW filter) prior to reaching the input terminal of semiconductor substrate 110. In general, the limited Q of silicon-based inductors has thus far prevented the practical integration of a high-Q RF filter on a semiconductor substrate, such as semiconductor substrate 110. FTNF 115 overcomes these previous limitations and provides one practical implementation of a high-Q RF filter for integration on a semiconductor substrate. The operation of FTNF 115 is further described in U.S. patent application Ser. No. 12/470,789, the disclosure of which is incorporated herein by reference.

After undergoing filtering by FTNF 115, LNA 120 receives the RF signal via single-ended RF signal path 140 and provides sufficient amplification to the desired channel of the RF signal to overcome the noise of subsequent stages. The amplified RF signal is provided at LNA output 160 for further processing (e.g., frequency conversion and baseband processing). LNA output 160 can be either single-ended or differential.

In an embodiment, FTNF 125 can be further utilized to attenuate any residual, out-of-band interferers that remain after initial filtering by FTNF 115. In an embodiment, FTNF 125 is coupled to the RF signal through an intermediary node between an input stage and a cascode stage of LNA 120.

In general, FTNF 125 is substantially similar to FTNF 115 and includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 155. The translated impedance forms a high-Q notch filter coupled between the RF signal, received via single-ended coupling 150, and ground. In an embodiment, the LO signal received at LO coupling 155 is the same LO signal coupled to LO coupling 145.

Figure 1B:
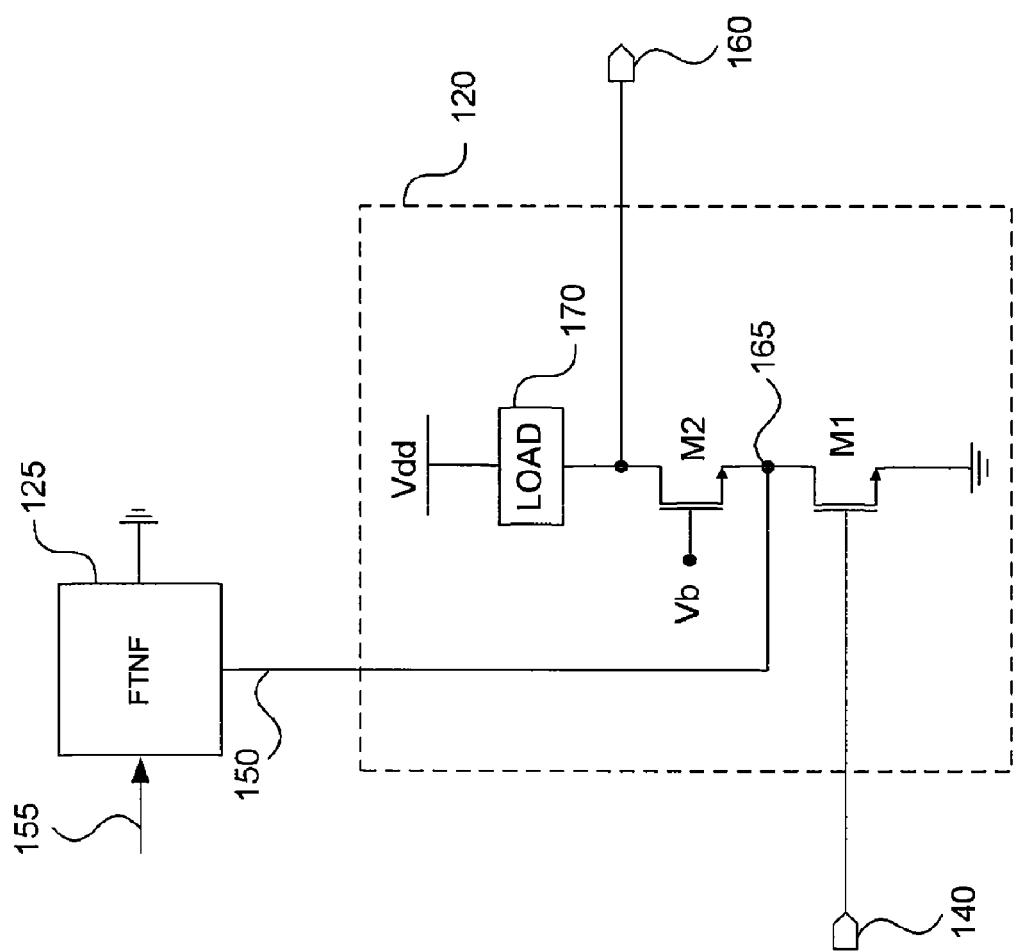
FIG. 1B illustrates an exemplary implementation of a single-ended LNA coupled to a single-ended FTNF, according to embodiments of the present invention.

FIG. 1B illustrates an exemplary implementation of LNA 120 as coupled to FTNF 125 in further detail, according to embodiments of the present invention. As illustrated in FIG. 1B, LNA 120 is implemented as a common source LNA and provides sufficient amplification to the desired channel to overcome the noise of subsequent stages.

The common-source implementation of LNA 120 includes a first field effect transistor (FET) M1 coupled at its gate to single-ended RF signal path 140. In an embodiment, single-ended RF signal path 140 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 165. In addition, FTNF 125 is further coupled to node 165 via single-ended coupling 150. M2 is biased at its gate via bias voltage Vb. In an embodiment, M2 is used to maximize gain and provide reverse isolation. The drain of M2 is coupled through a load 170 to a supply voltage $V_{dd}$. Load 170 can include any one of a resistor, inductor, capacitor, or any combination thereof. An amplified version of the RF signal is provided at the drain of M2. The amplified version of the RF signal is provided at LNA output 160.

It should be noted that the common-source implementation of LNA 120 represents one exemplary single-ended LNA configuration. As will be appreciated by one of ordinary skill in the art, other single-ended LNA configurations can be used without departing from the scope and spirit of the present invention.

Figure 2A:
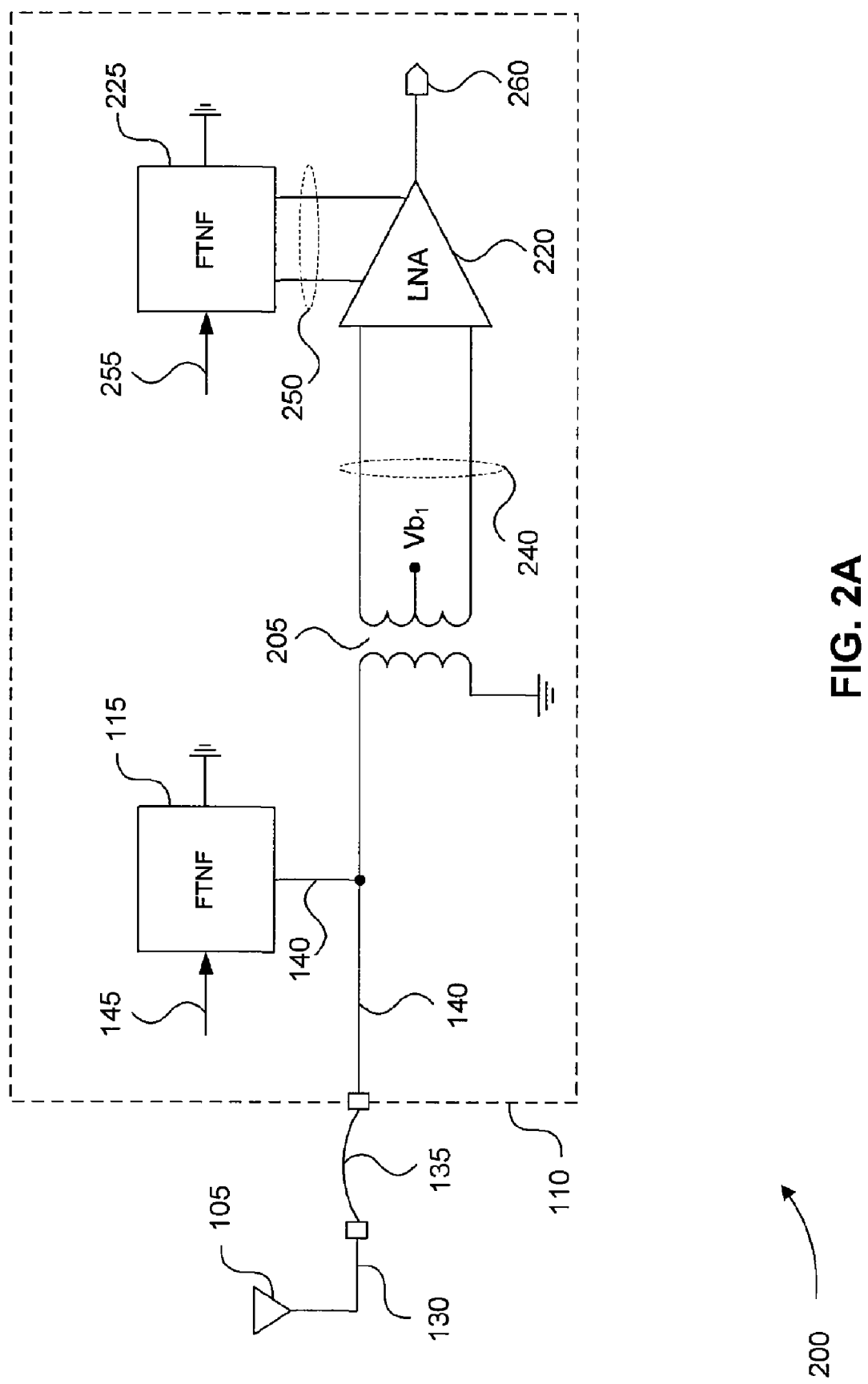
FIG. 2A illustrates an additional exemplary RF receiver front-end that provides for suppression of out-of-band interferers on a semiconductor substrate, according to embodiments of the present invention.

FIG. 2A illustrates a further exemplary RF receiver front-end 200 that provides for suppression of out-of-band interferers on a semiconductor substrate, according to embodiments of the present invention. RF receiver front-end 200 includes substantially the same structure as RF receiver front-end 100 illustrated in FIG. 1A. However, RF receiver front-end 200 further includes balun transformer 205, and replaces single-ended LNA 120 and single-ended FTNF 125 of FIG. 1A, with a differential LNA 220 and a differential FTNF 225.

Balun transformer 205 receives the RF signal from single-ended RF signal path 140 and transforms the RF signal into a differential RF signal. The differential RF signal is coupled to a differential RF signal path 240 by balun transformer 205. In an embodiment, bias voltage $V_{b1}$ of balun transformer 205 is capacitively coupled to ground.

After undergoing filtering by FTNF 115 and transformation by balun transformer 205, LNA 220 receives the differential RF signal via differential RF signal path 240 and provides sufficient amplification to the desired channel of the RF signal to overcome the noise of subsequent stages. The amplified RF signal is provided at LNA output 260 for further processing (e.g., frequency conversion and baseband processing). LNA output 260 can be either single-ended or differential.

In an embodiment, differential FTNF 225 can be further utilized to attenuate any residual, out-of-band interferers that remain after initial filtering by FTNF 115. In an embodiment, differential FTNF 225 is coupled to the RF signal through differential, intermediary nodes between an input stage and a cascode stage of differential LNA 220.

In general, differential FTNF 225 is substantially similar to FTNF 125 and includes a passive mixer (not shown) and a baseband impedance (not shown) that forms a low-Q band-stop filter. The passive mixer is configured to translate the baseband impedance to a higher frequency by an amount substantially equal to the frequency of a 25% duty cycle local oscillator (LO) signal received at LO coupling 255. The translated impedance forms a high-Q notch filter coupled between the RF signal, received via differential coupling 250, and ground. In an embodiment, the LO signal received at LO coupling 255 is the same LO signal coupled to LO coupling 145.

Figure 2B:
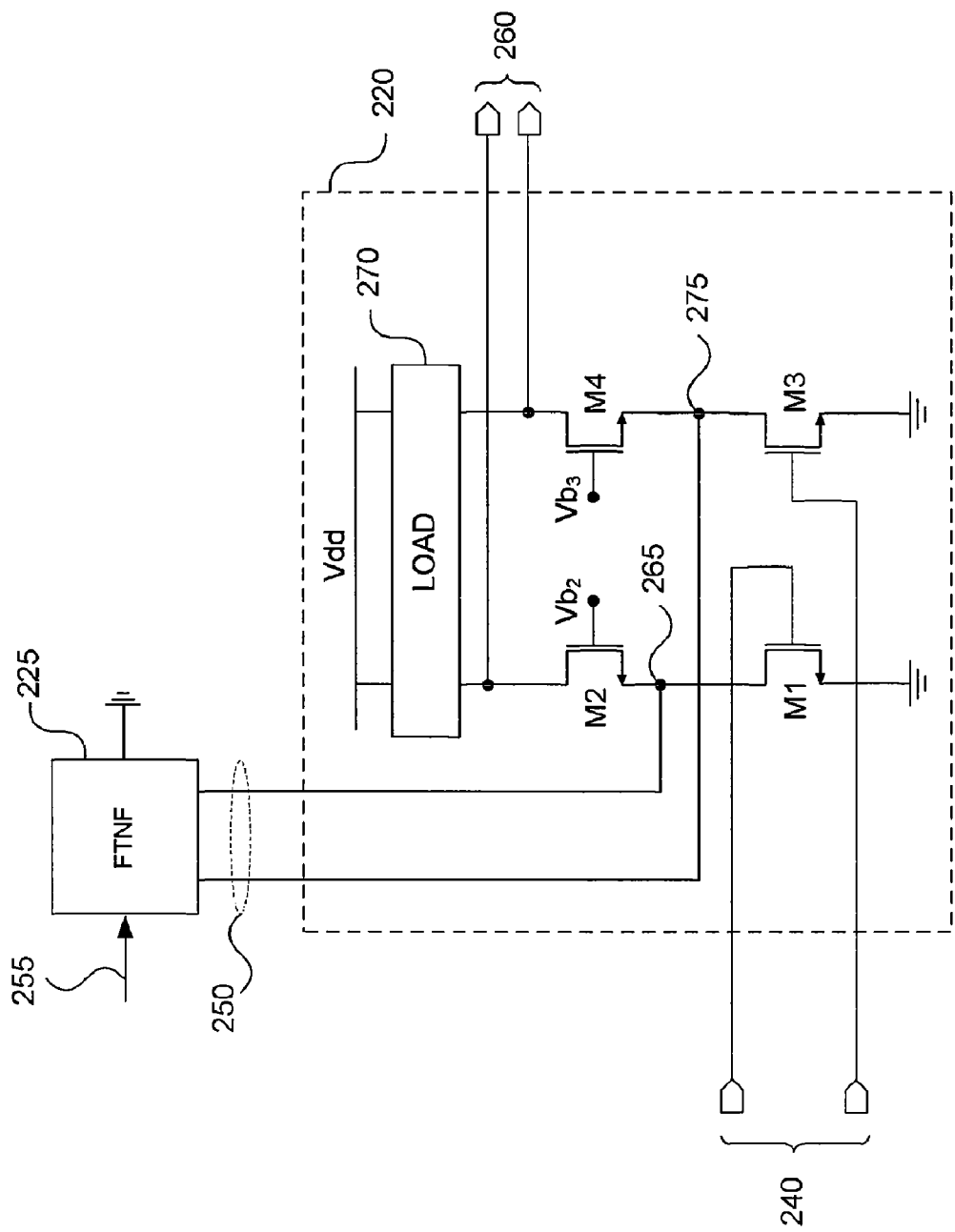
FIG. 2B illustrates an exemplary implementation of a differential LNA coupled to a differential FTNF, according to embodiments of the present invention.

FIG. 2B illustrates an exemplary implementation of LNA 220 as coupled to FTNF 225 in further detail, according to embodiments of the present invention. As illustrated in FIG. 2B, LNA 220 is implemented as a common source LNA and provides sufficient amplification to the desired channel to overcome the noise of subsequent stages.

The common-source implementation of LNA 220 includes a first field effect transistor (FET) M1 coupled at its gate to a positive-end of differential RF signal path 240. In an embodiment, the positive-end of differential RF signal path 240 can be coupled to the gate of M1 through an impedance, such as an inductor. The source of M1, although illustrated as being simply coupled to ground, can further be coupled through an impedance, such as an inductor, to ground. The drain of M1 is coupled to the source of a second FET M2 at a node 265. In addition, FTNF 225 is further coupled to node 265 via a positive-end of differential coupling 250. M2 is biased at its gate via bias voltage $Vb_2$. In an embodiment, M2 is used to maximize gain and provide reverse isolation. The drain of M2 is coupled through a load 270 to a supply voltage $V_{dd}$. Load 270 can include any one of a resistor, inductor, capacitor, or any combination thereof. An amplified version of the positive-end of the RF signal is provided at the drain of M2. The amplified version of the positive-end of the RF signal is provided at LNA output 260.

The common-source implementation of LNA 220 further includes a third FET M3 coupled at its gate to a negative-end of differential RF signal path 240. In an embodiment, the negative-end of differential RF signal path 240 can be coupled to the gate of M3 through an impedance, such as an inductor. The source of M3, although illustrated as being simply coupled to ground, can further be coupled through an impedance, such as an inductor, to ground. The drain of M3 is coupled to the source of a fourth FET M4 at a node 275. In addition, FTNF 225 is further coupled to node 275 via a negative-end of differential coupling 250. M4 is biased at its gate via bias voltage $Vb_3$. In an embodiment, M4 is used to maximize gain and provide reverse isolation. The drain of M4 is coupled through a load 270 to a supply voltage $V_{dd}$. Load 270 can include any one of a resistor, inductor, capacitor, or any combination thereof. An amplified version of the negative-end of the RF signal is provided at the drain of M4. The amplified version of the negative-end of the RF signal is provided at LNA output 260.

Figure 3:
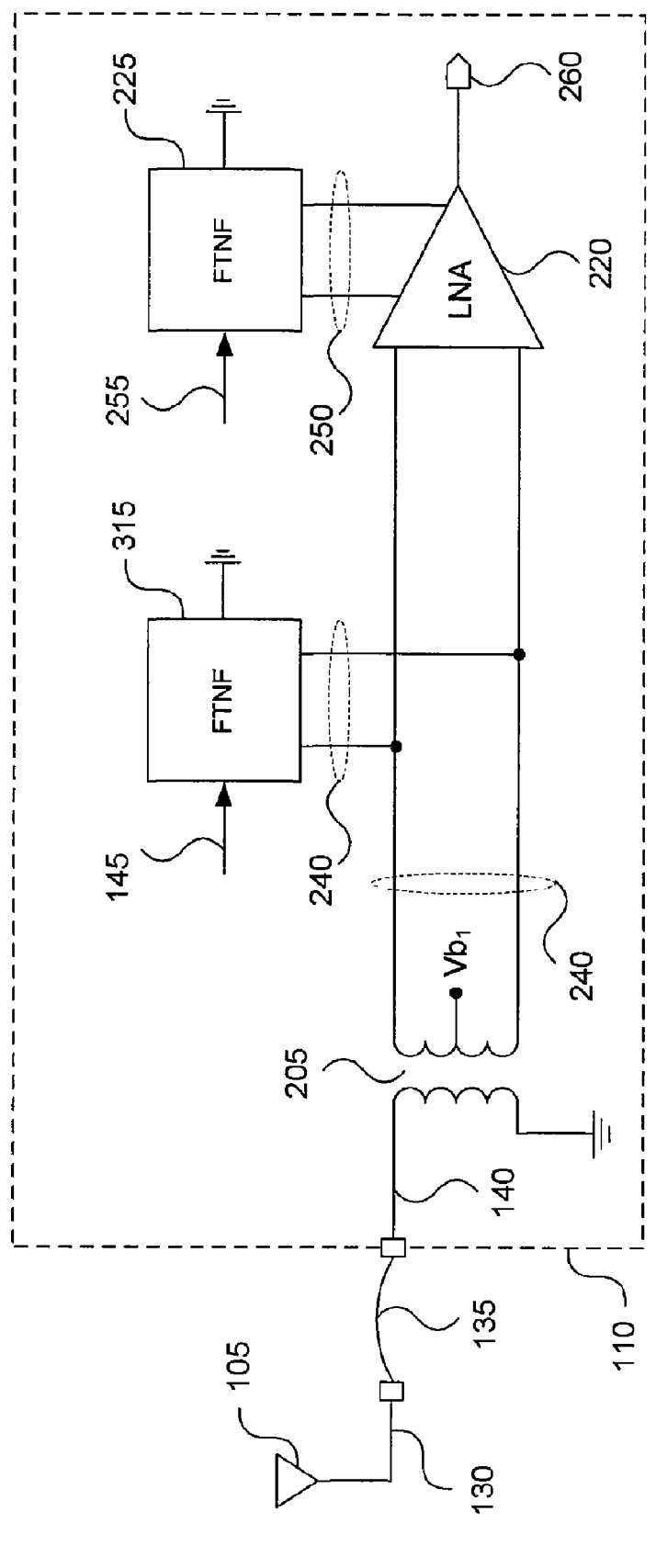
FIG. 3 illustrates yet another additional exemplary RF receiver front-end that provides for suppression of out-of-band interferers on a semiconductor substrate, according to embodiments of the present invention.

FIG. 3 illustrates yet another exemplary RF receiver front-end 300 that provides for suppression of out-of-band interferers on a semiconductor substrate, according to embodiments of the present invention. RF receiver front-end 300 includes substantially the same structure as RF receiver front-end 200 illustrated in FIG. 2A. However, RF receiver front-end 300 replaces single-ended FTNF 115 with a differential FTNF 315 coupled to differential RF signal path 240.

FIGS. 1A, 2A, and 3 provide exemplary configurations for SAW-less RF receiver front-ends. As will be appreciated by one of ordinary skill in the art based on the teachings herein, other configurations for SAW-less RF receiver front-ends are possible. These configurations are within the scope and spirit of the present invention.

Figure 4:
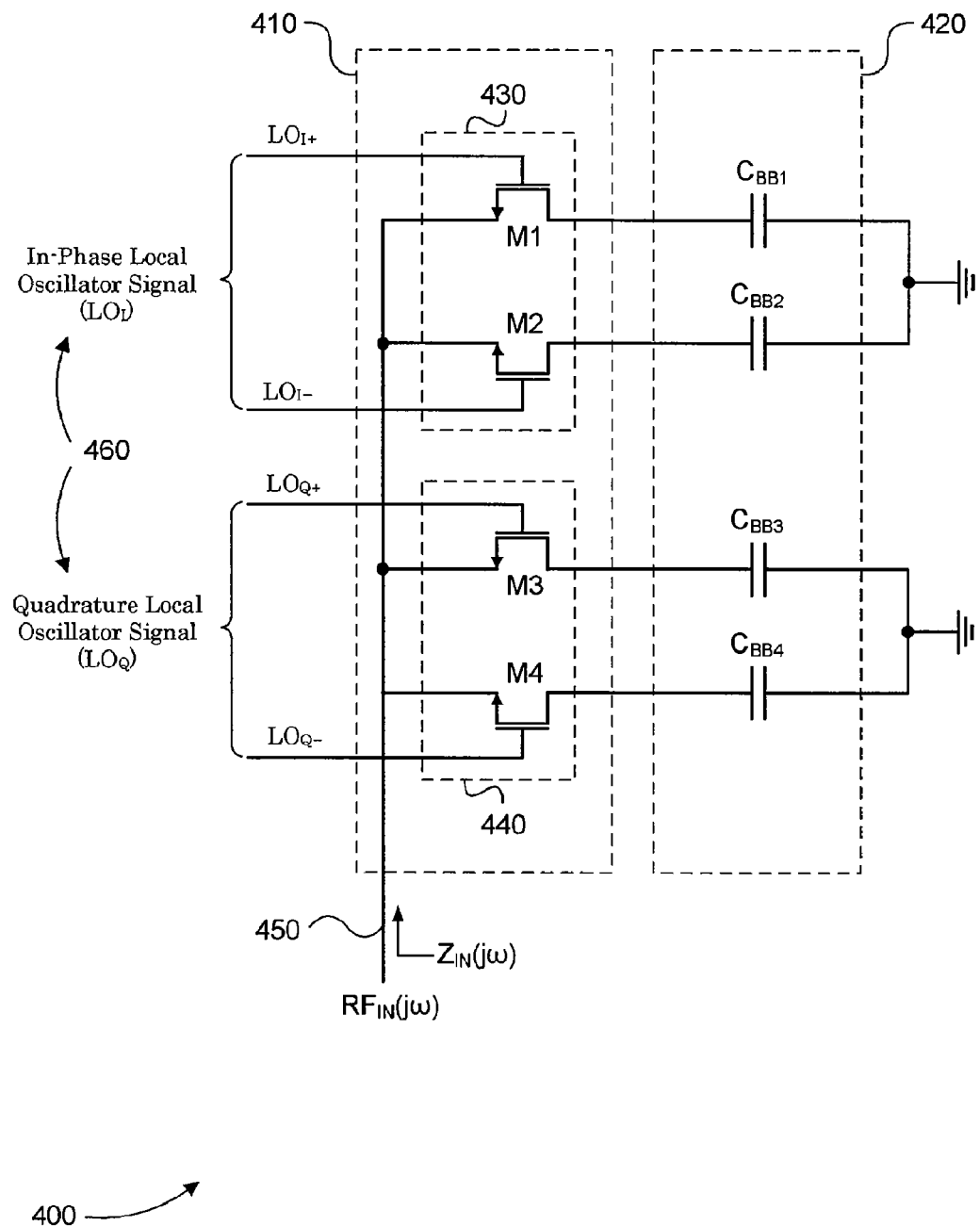
FIG. 4 illustrates an circuit-level implementation of a single-ended frequency translated notch filter (FTNF), according to embodiments of the present invention.

2. Frequency Translated Notch Filter 2.1 Single-Ended Frequency Translated Notch Filter FIG. 4 illustrates an exemplary implementation of a single-ended frequency translated notch filter (FTNF) 400, according to embodiments of the present invention. In an embodiment, single-ended FTNF 115 illustrated in FIGS. 1A and 2A, and single-ended FTNF 125 illustrated in FIGS. 1A and 1B, have the same configuration as single-ended FTNF 400 illustrated in FIG. 4.

FTNF 400 is single-ended in that it processes a single-ended RF signal ($RF_{IN}$) received at input 450. FTNF 400 includes a passive mixer 410 and a baseband impedance ($Z_{BB}$) 420. Baseband impedance 420 includes capacitors $C_{BB1}$, $C_{BB2}$, $C_{BB3}$, and $C_{BB4}$ that form a low-Q band-stop filter. Passive mixer 410 is configured to translate baseband impedance 420 to a higher frequency. The translated baseband impedance ($Z_{IN}$) forms a high-Q band-stop filter (i.e., a notch filter) that is presented at input 450.

Passive mixer 410 includes single-balanced mixers 430 and 440. Single-balanced mixer 430 includes switching devices M1 and M2. Single-balanced mixer 440 includes switching devices M3 and M4. In an embodiment, switching devices M1, M2, M3, and M4 are metal-oxide semiconductor field effect transistors (MOSFETs). Specifically, switching devices M1, M2, M3, and M4 are n-channel MOSFETs (NMOS). However, as will be appreciated by one of ordinary skill in the art, switching devices M1, M2, M3, and M4 can be implemented using any suitable switching device, including p-channel MOSFETs (PMOS), bipolar junction transistors (BJTs) and junction gate field effect transistors (JFETs). In the embodiment of FIG. 4, switching devices M1, M2, M3, and M4 are operated substantially in their linear mode when ON.

Single-balanced mixer 430 receives a differential in-phase LO signal ($LO_I$) at LO coupling 460. The in-phase LO signal has a frequency of $\omega_{LO}$ and a duty-cycle substantially equal to 25%. The gate of switching device M1 is coupled to the positive in-phase LO signal ($LO_{I+}$), and the gate of device M2 is coupled to the negative in-phase LO signal ($LO_{I-}$). Because the two in-phase LO signals ($LO_{I+}$ and $LO_{I-}$) are substantially 180-degrees out of phase, switching devices M1 and M2 are switched ON and OFF at non-overlapping intervals at the frequency of the in-phase LO signal ($\omega_{LO}$). The non-overlapping switching of switching devices M1 and M2 at a frequency of $\omega_{LO}$ effectively multiplies the RF input signal ($RF_{IN}$), coupled to the sources of switching devices M1 and M2, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the RF input signal. The frequency-converted, in-phase component of the RF input signal is provided differentially to baseband impedance 420.

Single-balanced mixer 440 receives a differential quadrature LO signal ($LO_Q$) at LO coupling 460. The quadrature LO signal has a frequency of $\omega_{LO}$ and a duty-cycle substantially equal to 25%. The gate of switching device M3 is coupled to the positive quadrature LO signal ($LO_{Q+}$), and the gate of switching device M4 is coupled to the negative quadrature LO signal ($LO_{Q-}$). Because the two quadrature LO signals ($LO_{Q+}$ and $LO_{Q-}$) are substantially 180-degrees out of phase, switching devices M3 and M4 are switched ON and OFF at non-overlapping intervals at the frequency of the quadrature LO signal ($\omega_{LO}$). The non-overlapping switching of switching devices M3 and M4 at a frequency of $\omega_{LO}$ effectively multiplies the RF input signal ($RF_{IN}$), coupled to the sources of switching devices M3 and M4, by ±1. This effective multiplication results in frequency conversion of the RF input signal by the sum ($\omega_{RF}+\omega_{LO}$) and difference ($\omega_{RF}-\omega_{LO}$ or $\omega_{LO}-\omega_{RF}$) in frequency between the quadrature LO signal ($LO_Q$) and the RF input signal. The frequency-converted, quadrature component of the RF input signal is provided differentially to baseband impedance 420.

The use of single-balanced mixers 430 and 440, effectively removes any DC offset component of the in-phase and quadrature LO signals, respectively. Removal of the DC component helps to reduce undesired feed-through of the RF input signal at the output of single-balanced mixers 430 and 440.

As noted above, baseband impedance 420 includes capacitors $C_{BB1}$, $C_{BB2}$, $C_{BB3}$, and $C_{BB4}$ that are respectively coupled between the drains of transistors M1-M4 and ground. In an embodiment, the capacitors $C_{BB1}$, $C_{BB2}$, $C_{BB3}$, and $C_{BB4}$ are each substantially equivalent and their impedances are given by (ignoring parasitics):

$$Z_{BB}(j\omega) = \frac{1}{j\omega C}$$

where j is the imaginary unit, $\omega$ is the frequency of the signal applied across the capacitor, and C is the capacitance. As is readily apparent from the above, $Z_{BB}$ presents an extremely large impedance for DC signals. However, as the frequency of the applied signal moves in either the positive or negative direction, away from DC (i.e., 0-MHz), the impedance $Z_{BB}$ decreases. Thus, capacitors $C_{BB1}$, $C_{BB2}$, $C_{BB3}$, and $C_{BB4}$, effectively form a low-Q band-stop filter centered at baseband.

Since the impedance of capacitors $C_{BB1}$, $C_{BB2}$, $C_{BB3}$, and $C_{BB4}$ varies with the frequency of the signal applied across their terminals, it follows that the frequency conversion of the RF signal by passive mixer 410 alters the impedance seen by the RF signal at input 450. Specifically, the impedance of capacitors $C_{BB1}$, $C_{BB2}$, $C_{BB3}$, and $C_{BB4}$ will each appear translated by $\pm\omega_{LO}$ as seen by the RF signal at input 450; that is, the low-Q band-stop filter formed by baseband impedance 420 is substantially translated by $\pm\omega_{LO}$, becoming a high-Q band-stop filter presented at input 450. A high-Q band-stop filter is commonly referred to as a notch filter.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}}$$

where $\omega_{RF}$ is the frequency of the RF signal received at input 450, $\omega_{LO}$ is the frequency of the LO signal received at LO coupling 460, and $R_{SW}$ is the switch resistance of switching devices M1-M4.

In an embodiment, $Z_{IN}$ is determined such that input 450 presents a high-impedance path to ground for frequency components of the RF signal within a desired frequency band and a low-impedance path to ground for frequency components of the RF signal outside the desired frequency band. The high-impedance (i.e., the notch) effectively precludes frequency components of the RF signal that are within the desired frequency band from being attenuated, where the desired frequency band is centered at $\omega_{LO}$. Conversely, the low-impedance effectively allows frequency components of the RF signal outside the desired frequency band to be attenuated. In other words, frequency components of the RF signal outside the desired frequency band are filtered. The desired frequency band can be taken as an output at input 450, because the undesired frequency components have been shunted to ground.

Low-Q capacitive impedances, such as $C_{BB1}$, $C_{BB2}$, $C_{BB3}$, and $C_{BB4}$, are readily capable of monolithic integration on a common semiconductor substrate together with passive mixer 410. Therefore, FTNF 400 provides a suitable notch filter implementation for integration on a semiconductor substrate, such as semiconductor substrate 110 of FIG. 1A.

It should be emphasized that FTNF 400 can be fully integrated in CMOS IC technology (or others, e.g., Bipolar, BiCMOS, and SiGe) and applied in wireless receiver systems including GSM, WCDMA, Bluetooth, and wireless LANs (e.g., IEEE 802.11).

2.2 Differential Frequency Translated Notch Filter

Figure 5:
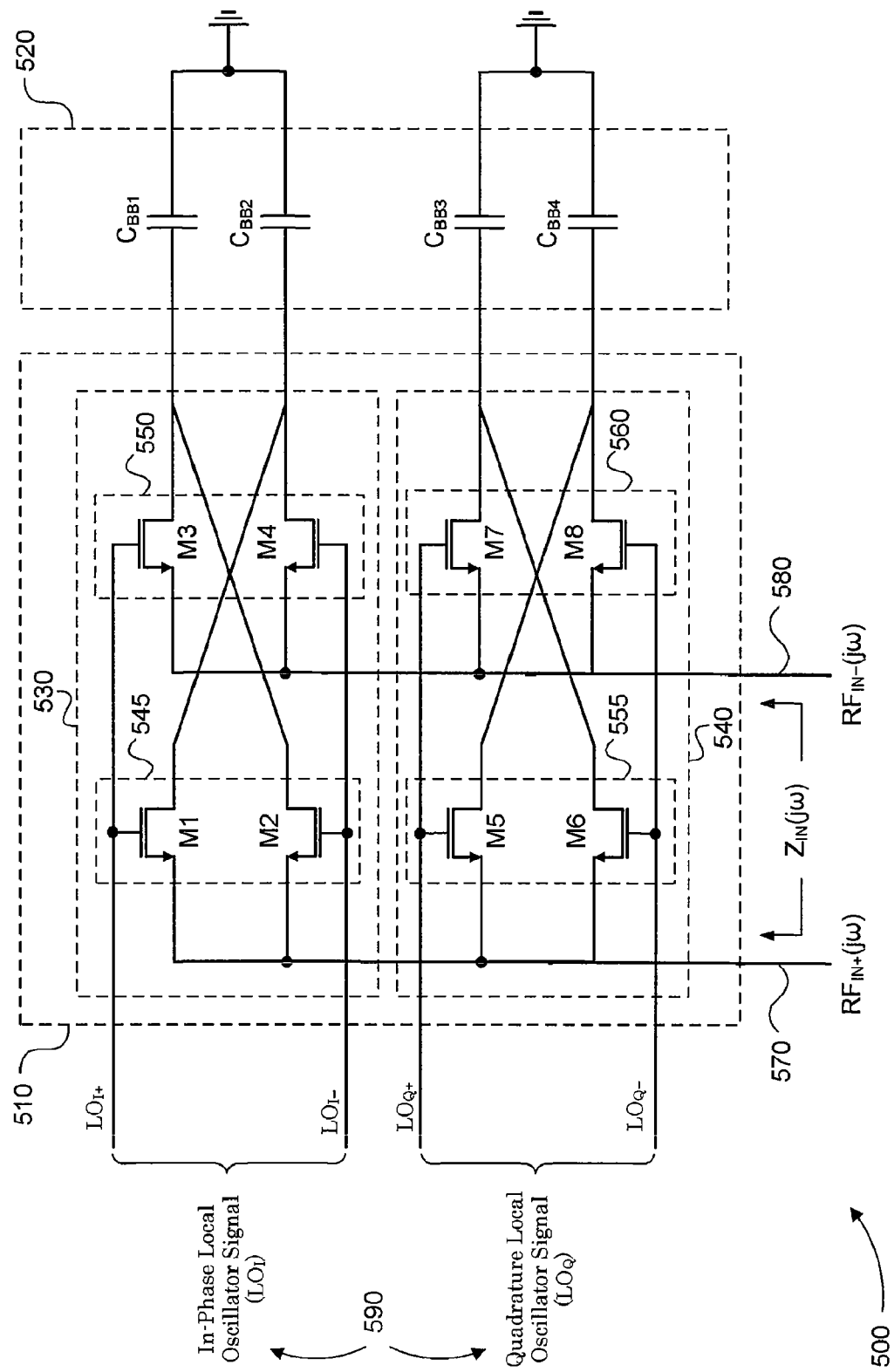
FIG. 5 illustrates an circuit-level implementation of a differential frequency translated notch filter (FTNF), according to embodiments of the present invention.

FIG. 5 illustrates an exemplary implementation of a differential frequency translated notch filter (FTNF) 500, according to embodiments of the present invention. In an embodiment, differential FTNF 225 illustrated in FIGS. 2A, 2B, and 3, and differential FTNF 315 illustrated in FIG. 3, have the same configuration as differential FTNF 500 illustrated in FIG. 5.

FTNF 500 is differential in that it processes a differential RF signal ($RF_{IN+}$ and $RF_{IN-}$) received at differential input pair 570 and 580. FTNF 500 includes a passive mixer 510 and a baseband impedance ($Z_{BB}$) 520. Baseband impedance 520 includes capacitors $C_{BB1}$, $C_{BB2}$, $C_{BB3}$, and $C_{BB4}$ that form a low-Q band-stop filter. Passive mixer 510 is configured to translate baseband impedance 520 to a higher frequency. The translated baseband impedance ($Z_{IN}$) forms a high-Q band-stop filter (i.e., a notch filter) that is presented at differential input pair 570 and 580.

Passive mixer 510 includes double-balanced mixers 530 and 540. Double-balanced mixer 530 includes switching devices M1, M2, M3, and M4. Double-balanced mixer 540 includes switching devices M5, M6, M7, and M8. In an embodiment, switching devices M1-M8 are metal-oxide semiconductor field effect transistors (MOSFETs). Specifically, switching devices M1-M8 are n-channel MOSFETs (NMOS). However, as will be appreciated by one of ordinary skill in the art, switching devices M1-M8 can be implemented using any suitable switching device, including p-channel MOSFETs (PMOS), bipolar junction transistors (BJTs) and junction gate field effect transistors (JFETs). In the embodiment of FIG. 2, switching devices M1-M8 are operated substantially in their linear mode when ON.

Double-balanced mixer 530 receives a differential, in-phase LO signal ($LO_I$) at LO coupling 590. The in-phase LO signal has a frequency of $\omega_{LO}$ and a duty-cycle substantially equal to 25%. Double-balanced mixer 530 is essentially formed from two single-balanced mixers 545 and 550. The gates of switching devices M1 and M3 are coupled to the positive in-phase LO signal ($LO_{I+}$), and the gates of switching devices M2 and M4 are coupled to the negative in-phase LO signal ($LO_{I-}$). Because the two in-phase LO signals ($LO_{I+}$ and $LO_{I-}$) are substantially 180-degrees out of phase, switching device pair M1 and M2 and switching device pair M3 and M4 are switched ON and OFF at non-overlapping intervals at the frequency of the in-phase LO signal ($\omega_{LO}$). The non-overlapping switching at a frequency of $\omega_{LO}$ effectively multiplies the positive RF signal ($RF_{IN+}$), coupled to the sources of switching devices M1 and M2, and the negative RF signal ($RF_{IN-}$), coupled to the sources of switching devices M3 and M4, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF signal. The frequency-converted in-phase component of the RF signal is provided differentially to baseband impedance 520.

Double-balanced mixer 540 receives a differential, quadrature LO signal ($LO_Q$) at LO coupling 590. The quadrature LO signal has a frequency of $\omega_{LO}$ and a duty-cycle substantially equal to 25%. Double-balanced mixer 540 is essentially formed from two single-balanced mixers 555 and 560. The gates of switching devices M5 and M7 are coupled to the positive quadrature LO signal ($LO_{Q+}$), and the gates of switching devices M6 and M8 are coupled to the negative quadrature LO signal ($LO_{Q-}$). Because the two quadrature LO signals ($LO_{Q+}$ and $LO_{Q-}$) are substantially 180-degrees out of phase, switching device pair M5 and M6 and switching device pair M7 and M8 are switched ON and OFF at non-overlapping intervals at the frequency of the quadrature LO signal ($\omega_{LO}$). The non-overlapping switching at a frequency of $\omega_{LO}$ effectively multiplies the positive RF signal ($RF_{IN+}$), coupled to the sources of switching devices M5 and M6, and the negative RF signal ($RF_{IN-}$), coupled to the sources of switching devices M7 and M8, by ±1. This effective multiplication results in frequency conversion of the differential RF signal by the sum ($\omega_{RF}+\omega_{LO}$) and difference ($\omega_{RF}-\omega_{LO}$ or $\omega_{LO}-\omega_{RF}$) in frequency between the in-phase LO signal ($LO_I$) and the differential RF signal. The frequency-converted quadrature component of the RF signal is provided differentially to baseband impedance 520.

The use of double-balanced mixers 530 and 540 effectively removes any DC offset component of the in-phase and quadrature LO signals, as well as any DC offset component of the differential RF signal. Removal of the DC components helps to reduce undesired feed-through of the RF signal and the LO signal at the output of double-balanced mixers 530 and 540.

As noted above, baseband impedance 520 includes capacitors $C_{BB1}$, $C_{BB2}$, $C_{BB3}$, and $C_{BB4}$ that are respectively coupled between the drains of switching devices M1-M8 and ground. In an embodiment, the capacitors $C_{BB1}$, $C_{BB2}$, $C_{BB3}$, and $C_{BB4}$ are each substantially equivalent and their impedances are given by (ignoring parasitics):

$$Z_{BB}(j\omega) = \frac{1}{j\omega C}$$

where j is the imaginary unit, ω is the frequency of the signal applied across the capacitor, and C is the capacitance. As is readily apparent from the above $Z_{BB}$ presents an extremely large impedance for DC signals. However, as the frequency of the applied signal moves in either the positive or negative direction, away from DC (i.e., 0-MHz), the impedance $Z_{BB}$ decreases. Thus, capacitors $C_{BB1}$, $C_{BB2}$, $C_{BB3}$, and $C_{BB4}$, effectively form a low-Q band-stop filter centered at baseband.

Since the impedance of capacitors $C_{BB1}$, $C_{BB2}$, $C_{BB3}$, and $C_{BB4}$ varies with the frequency of the signal applied across their terminals, it follows that the frequency conversion of the differential RF signal by passive mixer 510 alters the impedance seen by the differential RF signal at differential input pair 570 and 580. Specifically, the impedance of capacitors $C_{BB1}$, $C_{BB2}$, $C_{BB3}$, and $C_{BB4}$ will each appear translated by $\pm\omega_{LO}$ as seen by the differential RF signal at differential input pair 570 and 580; that is, the low-Q band-stop filter formed by baseband impedance 520 is substantially translated by $\pm\omega_{LO}$, becoming a high-Q band-stop filter presented at differential input pair 570 and 580. A high-Q band-stop filter is commonly referred to as a notch filter.

It can be shown that the translated baseband impedance ($Z_{IN}$) is substantially given by:

$$Z_{IN}(j\omega_{RF}) = R_{SW} + \frac{4}{\pi^2} \frac{j\omega_{RF}}{C_{BB}\{(j\omega_{RF})^2 + \omega_{LO}^2\}}$$

where $\omega_{RF}$ is the frequency of the differential RF signal received at differential input pair 570 and 580, $\omega_{LO}$ is the frequency of the LO signal received at LO coupling 590, and $R_{SW}$ is the switch resistance of switching devices M1-M8.

In an embodiment, $Z_{IN}$ is determined such that differential input pair 570 and 580 presents a high-impedance path to ground for frequency components of the differential RF signal within a desired frequency band and a low-impedance path to ground for frequency components of the differential RF signal outside the desired frequency band, where the desired frequency band is centered at $\omega_{LO}$. The high-impedance (i.e., the notch) effectively precludes frequency components of the differential RF signal that are within the desired frequency band from being attenuated. Conversely, the low-impedance effectively allows frequency components of the differential RF signal outside the desired frequency band to be attenuated. In other words, frequency components of the differential RF signal outside the desired frequency band are filtered. The desired frequency band can be taken as an output at differential input pair 570 and 580, because the undesired frequency components have been shunted to ground.

Low-Q capacitive impedances, such as $C_{BB1}$, $C_{BB2}$, $C_{BB3}$, and $C_{BB4}$, are readily capable of monolithic integration on a common semiconductor substrate together with passive mixer 510. Therefore, FTNF 500 provides a suitable notch filter implementation for integration on a semiconductor substrate, such as semiconductor substrate 110 of FIG. 1A.

It should be emphasized that FTNF 500 can be fully integrated in CMOS IC technology (or others, e.g., Bipolar, BiC-MOS, and SiGe) and applied in wireless receiver systems including GSM, WCDMA, Bluetooth, and wireless LANs (e.g., IEEE 802.11).

2.3 Magnitude and Phase Relationship

Figure 6:
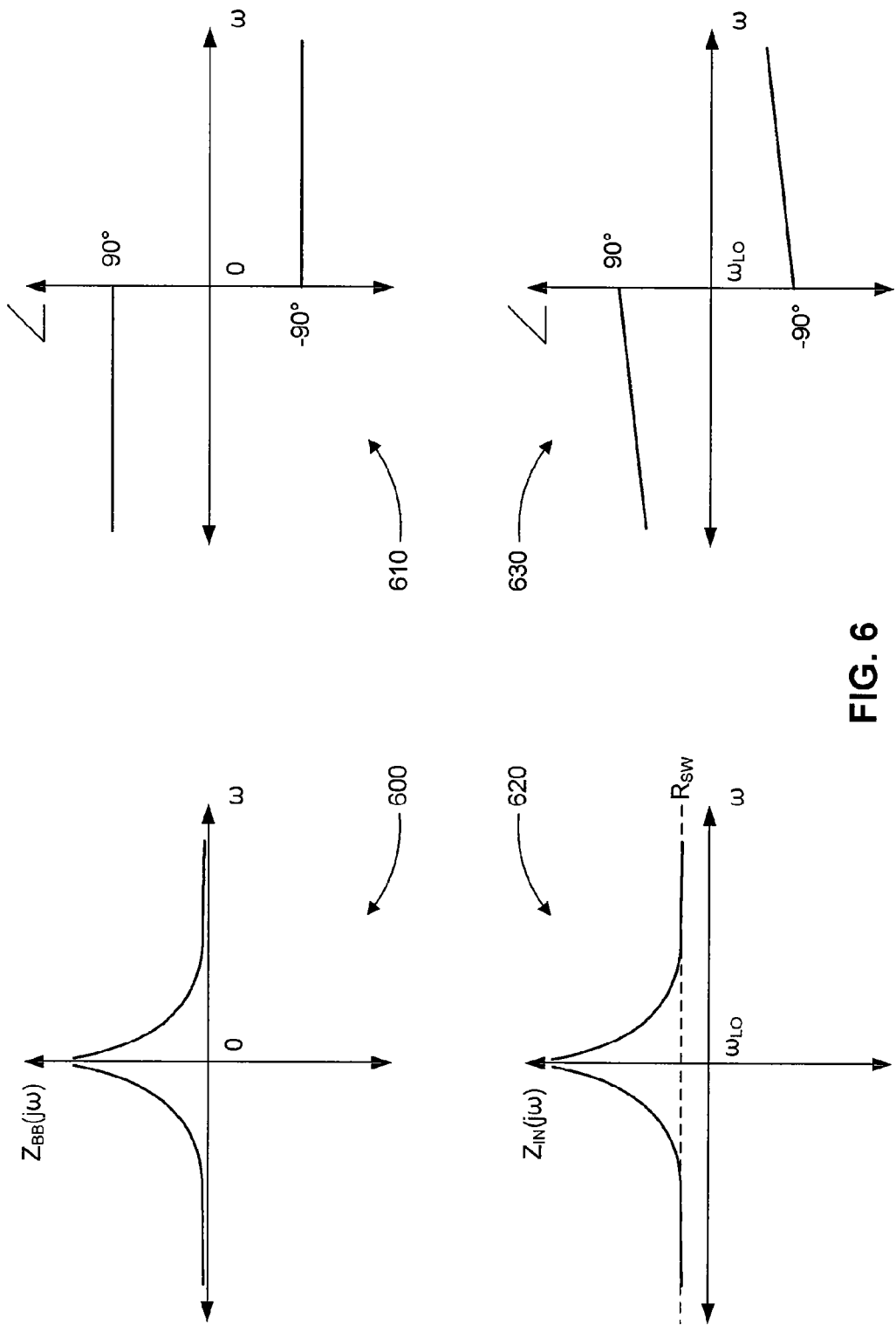
FIG. 6 illustrates the magnitude and phase relationship of the baseband impedance ($Z_{BB}$) and the translated baseband impedance ($Z_{IN}$) of the FTNF presented in FIG. 4 and FIG. 5, according to embodiments of the present invention.

FIG. 6 illustrates the magnitude and phase relationship of baseband impedances 420 ($Z_{BB}$) and 520 ($Z_{BB}$) and the translated baseband impedance ($Z_{IN}$) of FIGS. 5 and 6, according to embodiments of the present invention. Baseband impedances 420 and 520 have a frequency versus magnitude response 600 and a frequency versus phase response 610. For DC signals, baseband impedances 420 ($Z_{BB}$) and 520 ($Z_{BB}$) present an extremely large impedance. However, as the frequency of the applied signal moves in either the positive or negative direction, away from DC (i.e., 0-MHz), the impedance $Z_{BB}$ decreases. Thus, $Z_{BB}$ effectively forms a low-Q band-stop filter centered at baseband.

Frequency translated baseband impedance ($Z_{IN}$) has a frequency versus magnitude response 620 and a frequency versus phase response 630. The frequency versus magnitude response 620 clearly illustrates that the baseband impedance ($Z_{BB}$) has been substantially translated by $\omega_{LO}$ (only positive frequencies are illustrated in 620). For an applied signal at or near $\omega_{LO}$, $Z_{IN}$ presents an extremely large impedance. However, as the frequency of the applied signal moves in either the positive or negative direction, away from $\omega_{LO}$, the impedance $Z_{IN}$ quickly decreases to substantially the switch resistance $R_{SW}$ of switching devices M1-M4 of FIG. 4 or M1-M8 of FIG. 5. Thus, $Z_{IN}$ effectively forms a high-Q band-stop filter (i.e., a notch filter) centered at $\omega_{LO}$.

2.4 Local Oscillator Signals

Figure 7:
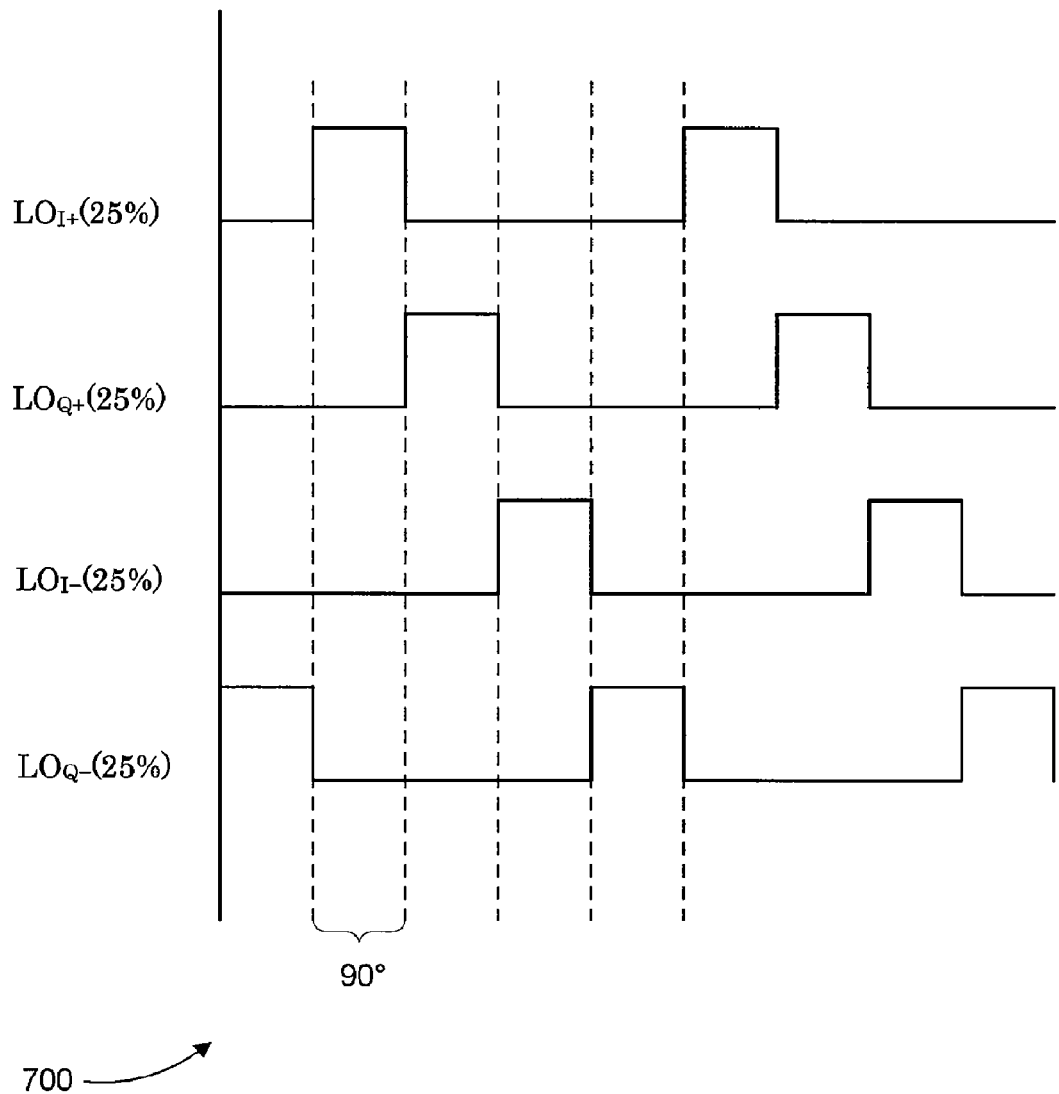
FIG. 7 illustrates a waveform diagram of exemplary LO signals for use by the passive mixer illustrated in FIG. 4 and FIG. 5, according to embodiments of the present invention.

FIG. 7 illustrates a waveform diagram of exemplary LO signals 700 for use by passive mixer 410 of FIGS. 4 and 510 of FIG. 5, according to embodiments of the present invention. LO signals 700 include two differential phases of an LO signal; namely, an in-phase LO signal ($LO_{I+}$ and $LO_{I-}$) and a quadrature LO signal ($LO_{Q+}$ and $LO_{Q-}$). The positive in-phase LO signal ($LO_{I+}$) has a phase shift of substantially 90-degrees relative to the positive quadrature LO signal ($LO_{Q+}$), and the negative in-phase LO signal ($LO_{I-}$) has a phase shift of substantially 90-degrees relative to the negative quadrature LO signal ($LO_{Q-}$). The positive and negative ends of the differential signals $LO_I$ and $LO_Q$ have a phase shift of substantially 180-degrees relative to each other.

LO signals 700 each have a duty cycle substantially equal to 25%. The 25% duty cycle of LO signals 700 helps to suppress undesired images of the RF signal, received at input 450 in FIG. 4 and differential input pair 570 and 580 in FIG. 5, from occurring at the output of passive mixers 410 and 510. In general, the duty cycles of LO signals 700 can be greater than or less than 25%, provided that adequate image suppression is still achieved.

3. Baseband Impedance—Design And Layout

In the FTNF implementations illustrated in FIGS. 4 and 5, baseband impedances 420 and 520 comprise capacitors $C_{BB1}$-$C_{BB4}$. These capacitors can be as large as 40 pF in some applications and can require considerable die area when implemented in an integrated circuit (IC) using typical capacitive structures. For example, poly-diffusion, poly-poly, or metal-poly structures offer relatively low capacitance per unit area (i.e., capacitive density) and can require a prohibitive amount of die area for large capacitors, such as 40 pF capacitors.

In an embodiment, baseband impedances 420 and 520, of the FTNF implementations illustrated in FIGS. 4 and 5, are implemented using MOS capacitors. Specifically, capacitors $C_{BB1}$-$C_{BB4}$, illustrated in FIGS. 4 and 5, are implemented using MOS capacitors. A MOS capacitor can be constructed by shorting the source and drain terminals together of a MOS transistor; the gate of the MOS transistor forms a first conducting plate of the capacitor and the source/drain of the MOS transistor forms a second conducting plate of the capacitor. In general, MOS capacitors can provide a high capacitive density.

Depending on the gate-to-drain (or gate-to-source) voltage, the capacitance of the MOS capacitor varies from a small value to a large value. Specifically, if the gate-to-drain voltage is insufficient to establish an inversion layer within the MOS transistor channel, the capacitance is equivalent to the series combination of the oxide capacitance ($C_{OX}$) and the depletion region capacitance of the MOS transistor, which is a relatively small value. However, if the gate-to-drain voltage is sufficient to establish an inversion layer within the MOS transistor channel, the capacitance is equivalent to the oxide capacitance ($C_{OX}$). In typical processes, the gate oxide is the thinnest layer. Therefore, MOS capacitors biased to have a strong inversion layer are quite dense and can save substantial die area for large valued capacitors, such as capacitors $C_{BB1}$-$C_{BB4}$.

Figure 8:
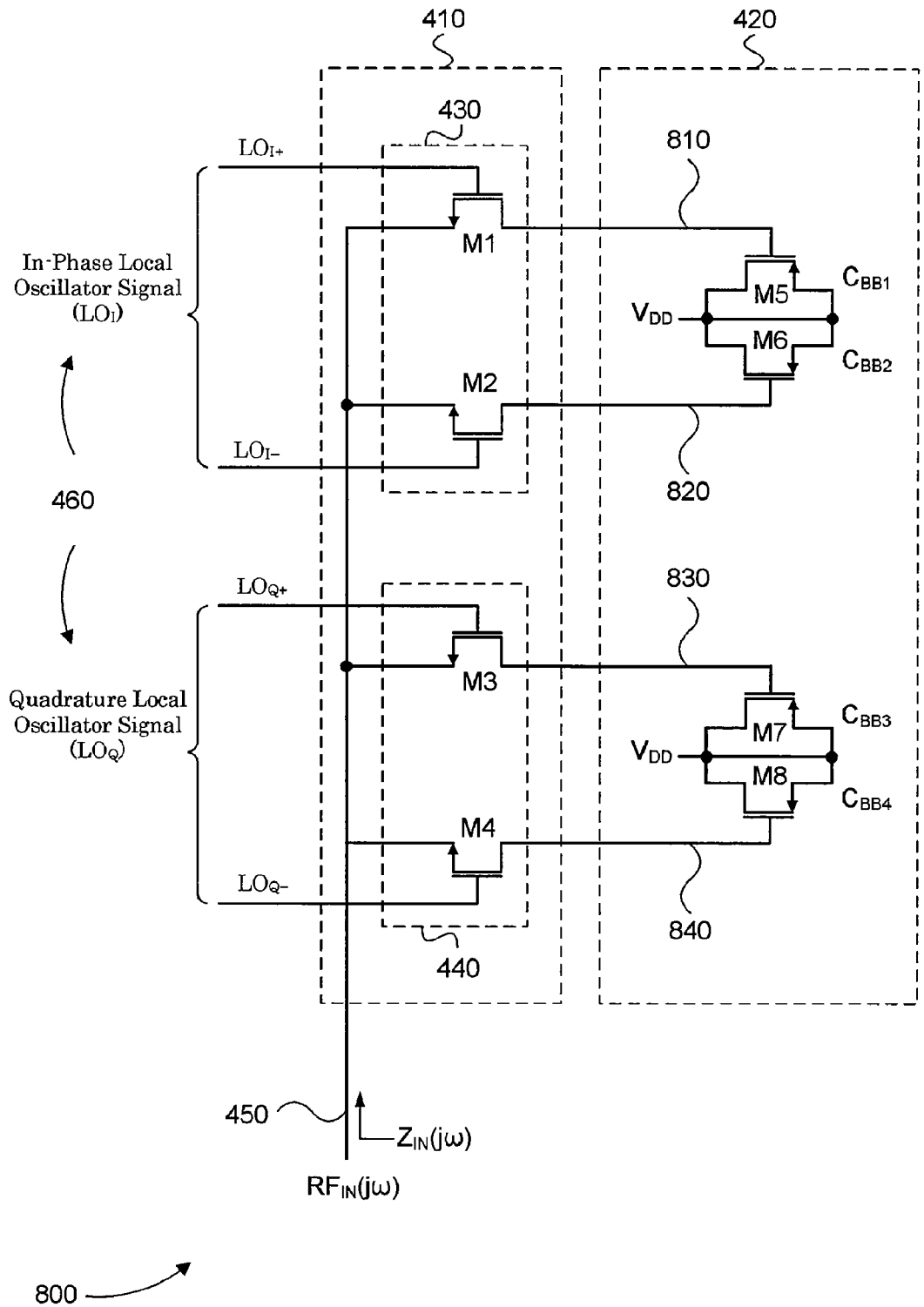
FIG. 8 illustrates an exemplary FTNF that implements MOS capacitors, according to embodiments of the present invention.

FIG. 8 illustrates an exemplary FTNF 800 that implements MOS capacitors, according to embodiments of the present invention. In general, FTNF 800 has substantially the same structure and functionality as FTNF 400 described above in FIG. 4. However, capacitors $C_{BB1}$-$C_{BB4}$ of baseband impedance 420 have been implemented using MOS capacitors. Specifically, PMOS transistor M5 implements MOS capacitor $C_{BB1}$, PMOS transistor M6 implements MOS capacitor $C_{BB2}$, PMOS transistor M7 implements MOS capacitor $C_{BB3}$, and PMOS transistor M8 implements MOS capacitor $C_{BB4}$. As will be appreciated by one of ordinary skill in the art, depending upon bias and operating conditions, PMOS transistors M5-M8 can be implemented using NMOS transistors.

The gate of each transistor M5-M8 is coupled to a respective frequency translated RF signal received from passive mixer 410. Specifically, the gate of transistor M5 is coupled to frequency translated RF signal 810, the gate of transistor M6 is coupled to frequency translated RF signal 820, the gate of transistor M7 is coupled to frequency translated RF signal 830, and the gate of transistor M8 is coupled to frequency translated RF signal 840. The source and drain of each transistor M5-M8 are shorted together as illustrated in FIG. 8 and tied to positive voltage $V_{DD}$, which further provides a path to ground for AC signals.

To ensure a strong inversion layer exists over the entire operating range or voltage swing applied across the MOS capacitors, the drain-to-gate voltage ($V_{DG}$) should be greater than the absolute value of the threshold voltage ($V_{TH}$) of PMOS transistors M5-M8. While operating in a strong inversion region, the MOS capacitor provides not only a high capacitive density, but further exhibits a substantially constant capacitance over varying values of $V_{DG}$ (i.e., the voltage applied across the MOS capacitor).

Figure 9:
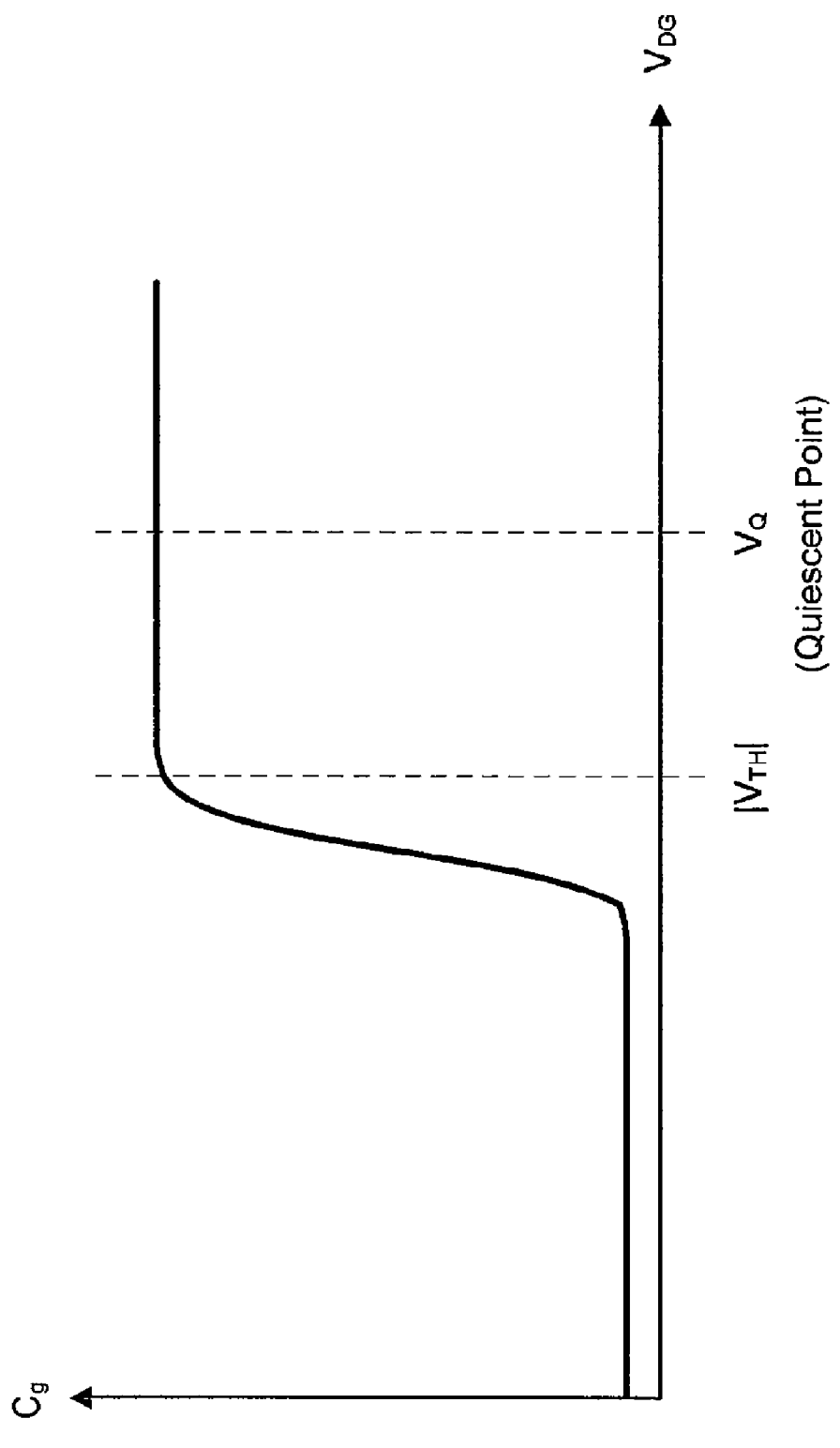
FIG. 9 illustrates an exemplary plot of capacitance ($C_g$) versus drain-to-gate voltage ($V_{DG}$) for the MOS capacitors illustrated in FIG. 8.

FIG. 9 illustrates an exemplary plot 900 of capacitance ($C_g$) versus drain-to-gate voltage ($V_{DG}$) for the MOS capacitors illustrated in FIG. 8. As can be seen from exemplary plot 900, $C_g$ becomes large and constant if $V_{DG}$ exceeds the absolute value of the threshold voltage ($V_{TH}$). By placing the quiescent point (i.e., the DC operating point) of $V_{DG}$ at a voltage $V_Q$ as illustrated in FIG. 9, a large capacitance is achieved that is substantially constant over large swings in $V_{DG}$.

For example, assuming the absolute value of $V_{TH}$ is 0.5 V, then a quiescent voltage of 0.8 V for $V_{DG}$ allows for a swing of +/−0.3 V across each MOS capacitor. In an embodiment, a swing of +/−0.3 V across each MOS capacitor provides for a sufficient operating range during the reception and attenuation of out-of-band blockers as large as 0 dBm.

In a further embodiment, the gates of PMOS transistors M5-M8 are biased at 550 mV. The 550 mV bias voltage can be attributed to a bias of an LNA input stage in an RF receiver front-end, such as RF receiver front end 100 illustrated in FIG. 1. Assuming $V_{DD}$ is 1.3 V, a 550 mV bias voltage on the gate of PMOS transistors M5-M8 provides for a quiescent point of approximately 0.8 V for $V_{DG}$ and a tolerable swing of +/−0.3 V across each MOS capacitor.

Figure 10:
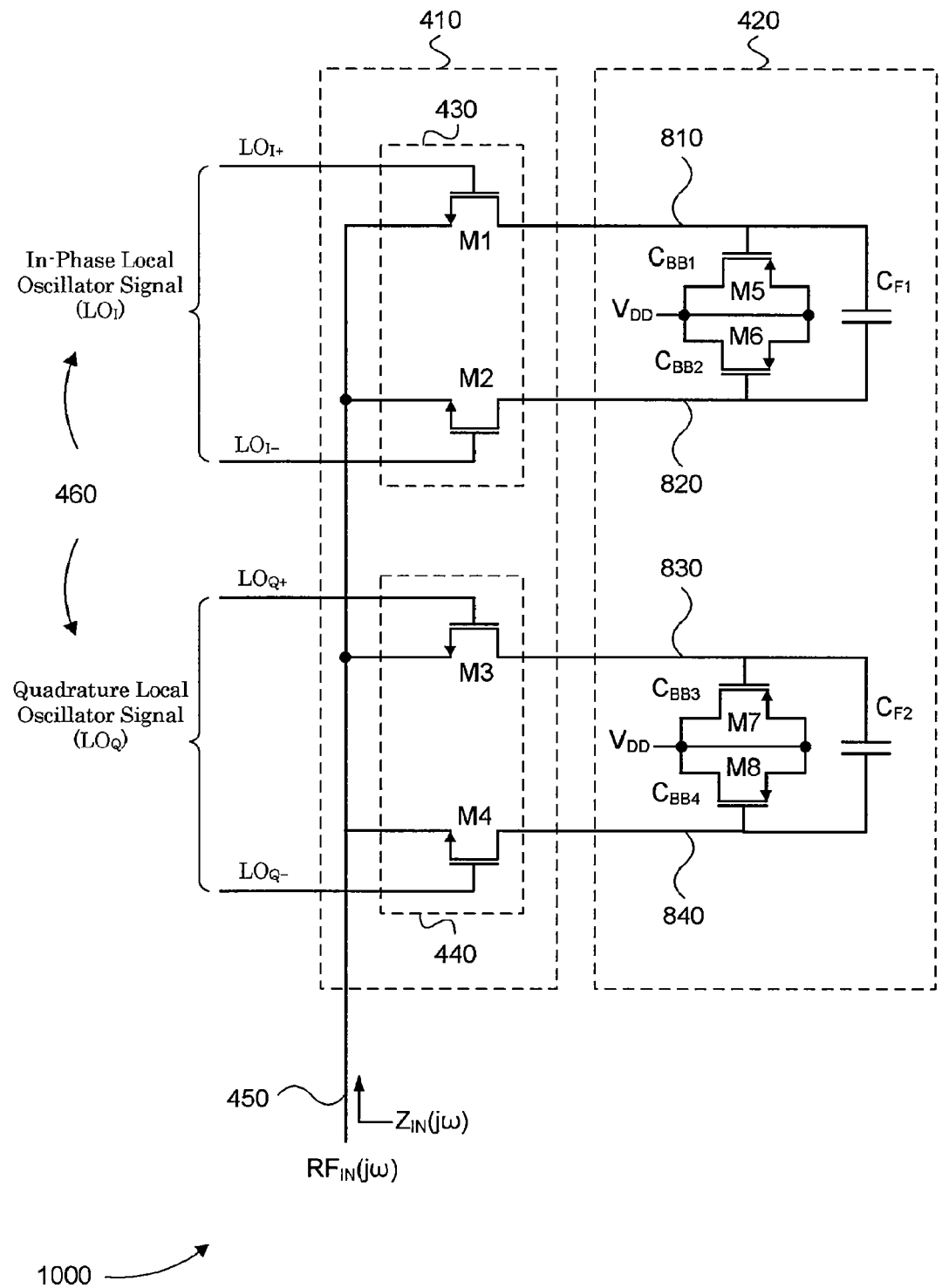
FIG. 10 illustrates an exemplary FTNF that implements MOS capacitors and fringe capacitors, according to embodiments of the present invention.

FIG. 10 illustrates an exemplary FTNF 1000 that implements MOS capacitors and fringe capacitors, according to embodiments of the present invention. In general, FTNF 1000 has substantially the same structure as FTNF 800 described above and illustrated in FIG. 8. However, capacitors $C_{BB1}$-$C_{BB4}$ of baseband impedance 420 have been implemented using not only MOS capacitors, but further using fringe capacitors. Specifically, fringe capacitors $C_{F1}$ and $C_{F2}$ are implemented as differential capacitors. Fringe capacitor $C_{F1}$ adds to the capacitance provided by the MOS capacitors formed by MOS transistors M5 and M6, and fringe capacitor $C_{F2}$ adds to the capacitance provided by the MOS capacitors formed by MOS transistors M7 and M8.

Although fringe capacitors typically provide a relatively low capacitive density, fringe capacitors can be provided with little or no additional area expense in an IC implementation utilizing MOS capacitors. Specifically, fringe capacitors $C_{F1}$ and $C_{F2}$ can be implemented within the die area above the MOS capacitors, thereby incurring little or no additional area expense.

Figure 11:
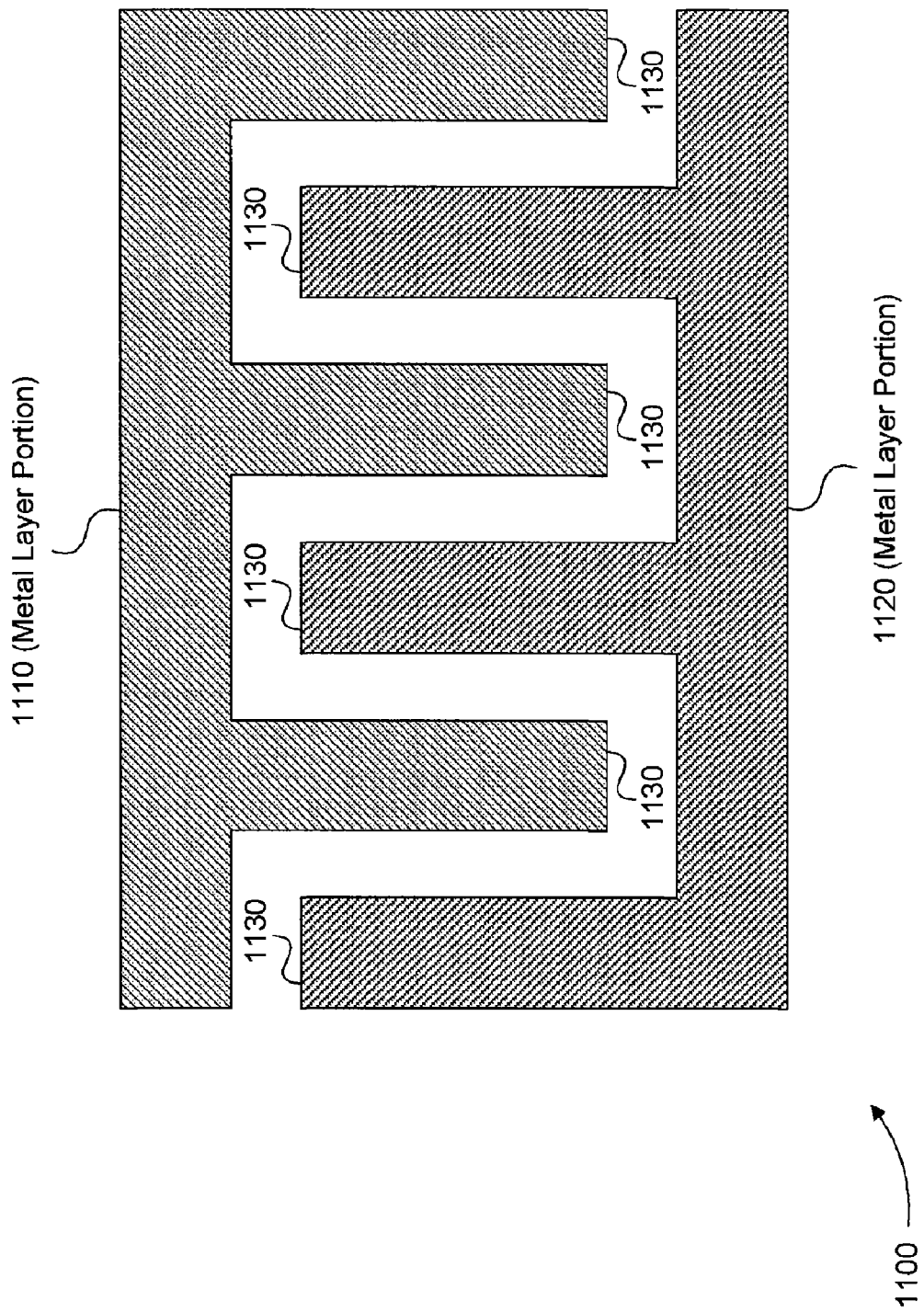
FIG. 11 illustrates a top view of an exemplary fringe capacitor implemented on a semiconductor substrate, according to embodiments of the present invention.
Figure 12:
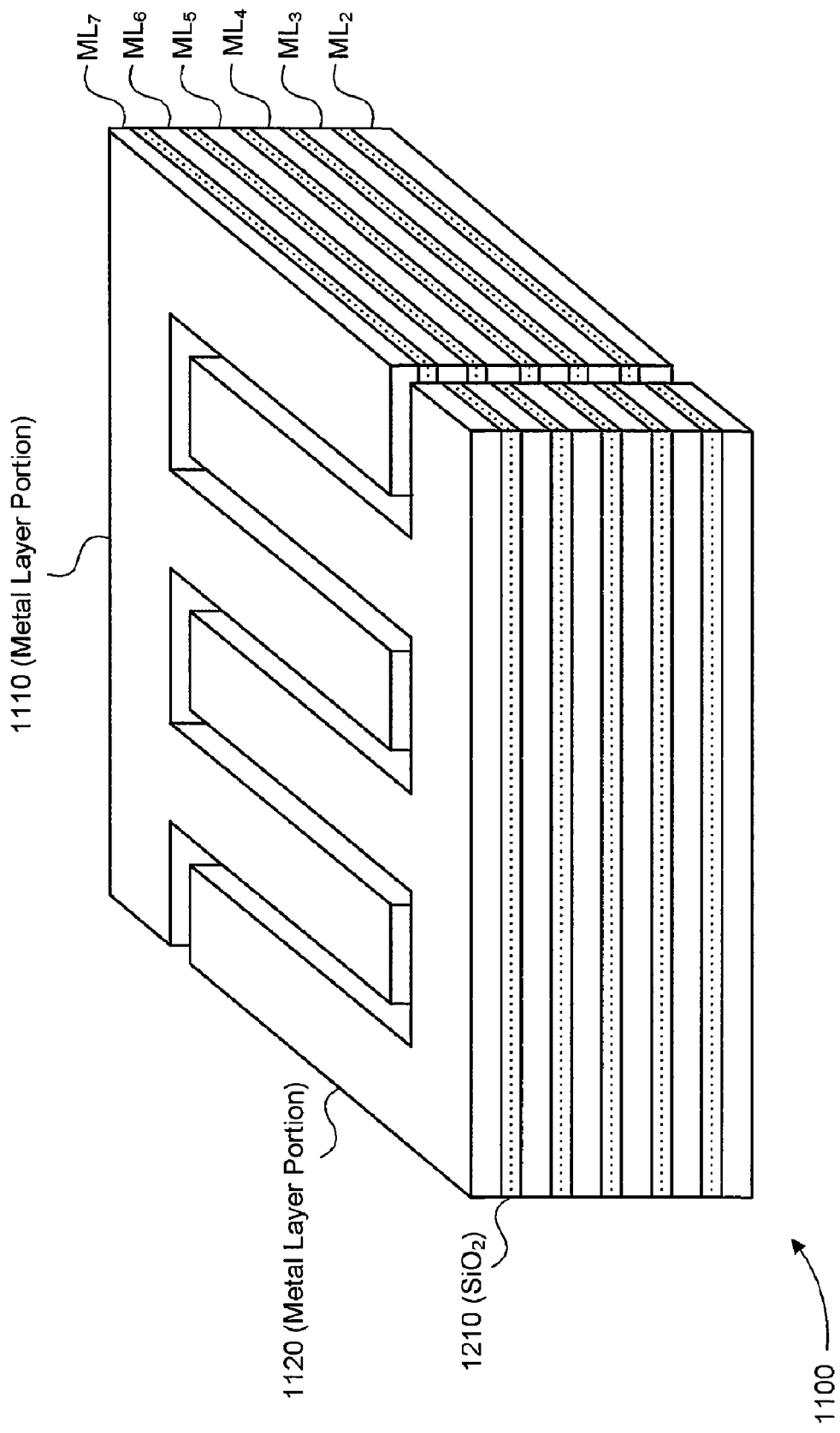
FIG. 12 illustrates a perspective view of the fringe capacitor of FIG. 11 implemented on a semiconductor substrate, according to embodiments of the present invention.
Figure 13:
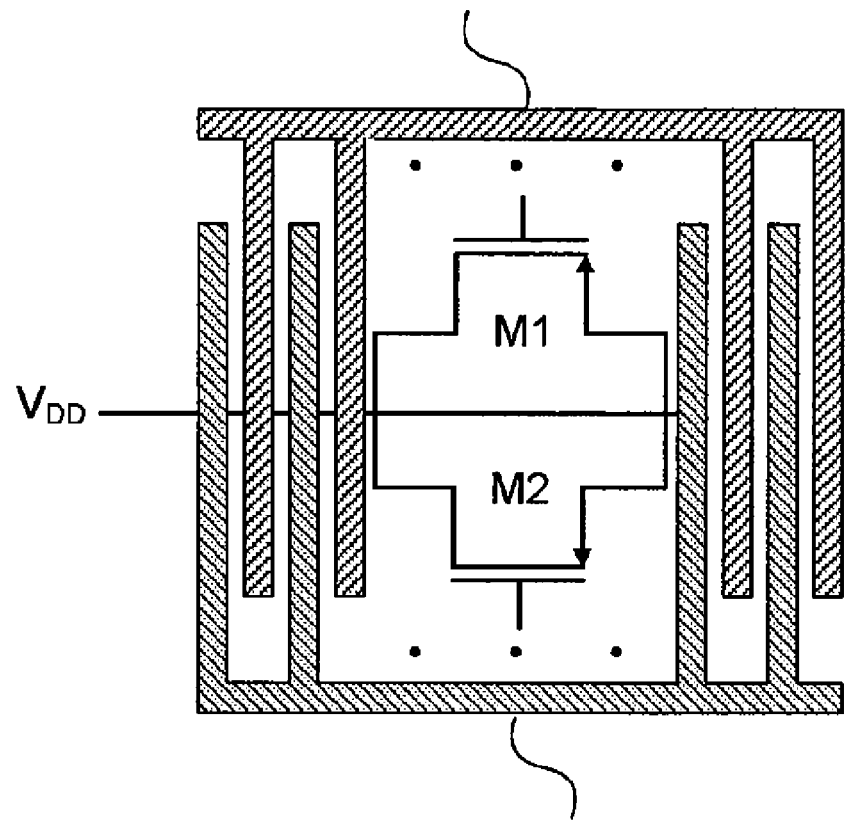
FIG. 13 illustrates a unit-cell that includes a fringe capacitor and MOS capacitors formed by MOS transistors, according to embodiments of the present invention.

During layout of a MOS capacitor, upper metal layers of a typical semiconductor process are not used. For example, in a typical implementation of a MOS capacitor only metal layer 1 (i.e., $ML_1$) is used. Consequently, in a semiconductor process that supports seven metal layers, $ML_1$-$ML_7$, the metal layers from $ML_2$-$ML_7$ are unused in the area directly above the MOS capacitor implementation. Thus, a fringe capacitor can be formed in the unused area above the MOS capacitor using the additional metal layers. FIGS. 11-13 illustrate exemplary layout approaches for a fringe capacitor, such as fringe capacitors $C_{F1}$ and $C_{F2}$, and the positioning of the fringe capacitor on top of a MOS capacitor.

FIG. 11 illustrates a top view of an exemplary fringe capacitor 1100 implemented on a semiconductor substrate, according to embodiments of the present invention. In an embodiment, fringe capacitors $C_{F1}$ and $C_{F2}$ are implemented in the same manner as fringe capacitor 1100. As illustrated in FIG. 11, fringe capacitor 1100 includes a first metal layer portion 1110 and a second metal layer portion 1120. The two metal layer portions form the two respective plates of fringe capacitor 1100.

As further illustrated in FIG. 11, each metal layer portion 1110 and 1120 includes a plurality of interdigitated metal fingers 1130. From a top view, the interdigitated metal fingers 1130 are separated by space. In an embodiment, this space is minimized to the smallest distance allowed by the particular semiconductor process used to implement fringe capacitor 1100.

FIG. 12 illustrates a perspective view of fringe capacitor 1100 implemented on a semiconductor substrate, according to embodiments of the present invention. As illustrated in FIG. 12, fringe capacitor 1100 includes a plurality of metal layers $ML_2$-$ML_7$. Each metal layer, $ML_2$-$ML_7$, includes a metal layer portion 1110 and a metal layer portion 1120. Metal layer portions 1110 form one plate of fringe capacitor 1100, and metal layer portions 1120 form the other plate. Each metal layer $ML_2$-$ML_7$ is further separated from the metal layer portions either above or below it by dielectric 1210. In an embodiment, the dielectric 1210 is silicon dioxide ($SiO_2$).

FIG. 13 illustrates a unit-cell 1300 that includes fringe capacitor 1100 and MOS capacitors formed by MOS transistors M1 and M2, according to embodiments of the present invention. As illustrated, fringe capacitor 1100, formed from multiple metal layers, resides on top of the MOS capacitors formed by MOS transistors M1 and M2. The MOS capacitors are at least partially implemented in a semiconductor substrate. The gate of MOS transistor M1 is coupled to metal layer portion 1110 and the gate of MOS transistor M2 is coupled to metal layer portion 1120. The source and drain of MOS transistors M1 and M2 are shorted together and tied to positive voltage $V_{DD}$, which further provides a path to ground for AC signals.

In an embodiment, unit-cell 1300 represents a small unit of capacitance, such as 1 pF. Unit-cell 1300 can be replicated like a standard-cell in an IC implementation and joined in parallel to form a desired capacitance. For example, unit-cell 1300 can be replicated and joined in parallel to produce capacitor $C_{BB1}$ of FTNF 1000 as illustrated in FIG. 10. The replicated unit-cells 1300 can be joined in parallel by abutment.

Figure 14:
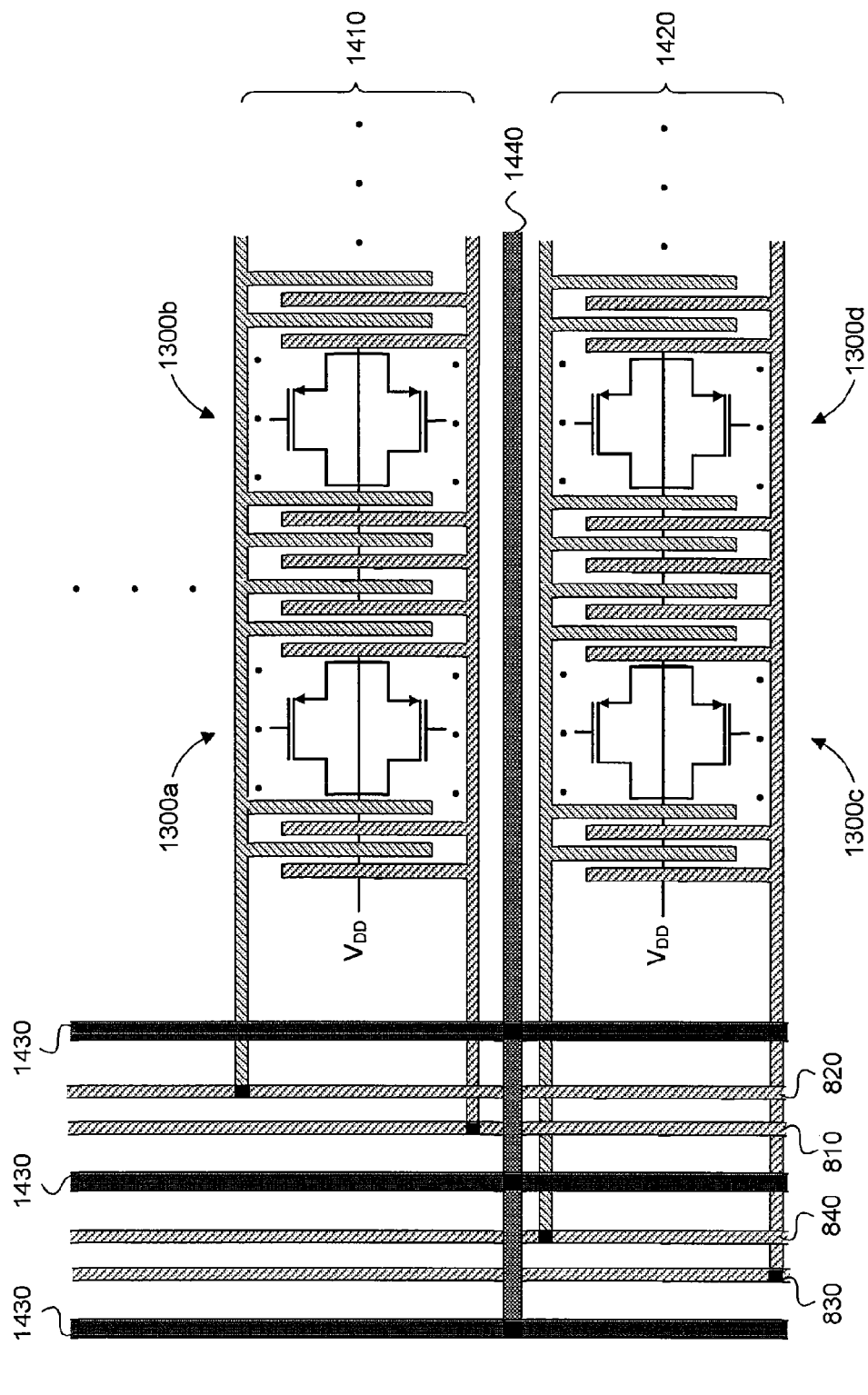
FIG. 14 illustrates an implementation and layout of the baseband impedance illustrated in FIG. 10, according to embodiments of the present invention.

FIG. 14 illustrates an implementation and layout 1400 for baseband impedance 420 illustrated in FIG. 10, according to embodiments of the present invention. Each capacitor $C_{BB1}$-$C_{BB4}$ of baseband impedance 420 is implemented using a MOS capacitor and a fringe capacitor as illustrated schematically in FIG. 8. Unit-cells 1300 comprise unit-values of capacitance generated from a pair of MOS capacitors and a fringe capacitor. Unit-cells 1300 are replicated and abutted to produce the desired capacitance for each capacitor $C_{BB1}$-$C_{BB4}$.

In an embodiment, first row 1410 of unit-cells 1300 at least partially forms capacitors $C_{BB1}$ and $C_{BB2}$. First row 1410 only illustrates two unit-cells 1300a and 1300b in abutment. However, as will be appreciated by one of ordinary skill in the art, additional unit-cells 1300 can be added to row 1410 to increase the capacitance provided.

In a further embodiment, second row 1420 at least partially forms capacitors $C_{BB3}$ and $C_{BB4}$. Second row 1420 only illustrates two unit-cells 1300c and 1300d in abutment. However as will be appreciated by one of ordinary skill in the art, additional unit-cells 1300 can be added to row 1420 to increase the capacitance provided.

Frequency translated RF signals 810, 820, 830, and 840 run parallel to each other and are coupled to unit-cells 1300a, 1300b, 1300c, and 1300d as illustrated in FIG. 14. In an embodiment, the parallel lines of frequency translated RF signals 810 and 820 are spaced as close to each other as allowed by the semiconductor process. The two, parallel lines add to the capacitance of capacitors $C_{BB1}$ and $C_{BB2}$. By minimizing the space between the parallel lines of frequency translated RF signals 810 and 820 their added capacitance is maximized.

In a further embodiment, the parallel lines of frequency translated RF signals 830 and 840 are spaced as close to each other as allowed by the semiconductor process. The two, parallel lines add to the capacitance of capacitors $C_{BB3}$ and $C_{BB4}$. By minimizing the space between the parallel lines of frequency translated RF signals 830 and 840 their added capacitance is maximized.

As further illustrated in FIG. 14, layout 1400 includes ground lines 1430. Ground lines 1430 isolate frequency translated RF signals 810 and 820 from frequency translated RF signals 830 and 840. In other words, ground lines 1430 prevent undesired capacitive coupling or cross talk between the two pairs of frequency translated RF signals. An additional ground line 1440 is further provided to isolate first row 1410 from second row 1420. In an embodiment, ground line 1440 includes each metal layer supported by the semiconductor process (e.g., $ML_1$-$ML_7$) to effectively isolate the multi-layer fringe capacitors of each unit cell 1300.

It should be noted that layout 1400 can be applied to the baseband impedance of any FTNF, including the baseband impedance of differential FTNF 500 illustrated in FIG. 5.

4. Conclusion

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A frequency translated notch filter, comprising:
 a passive mixer configured to mix a radio frequency (RF) signal received at a first mixer input and a local oscillator (LO) signal received at a second mixer input; and
 a baseband impedance coupled between an output of the passive mixer and ground, the baseband impedance comprising a capacitor implemented using a metal-oxide semiconductor (MOS) capacitor,
 wherein a drain to gate voltage of the MOS capacitor is biased to provide a substantially constant capacitance over changes in the RF signal,
 wherein the first mixer input presents a high-impedance path to ground for frequency components of the RF signal within a desired frequency band and a low-impedance path to ground for frequency components of the RF signal outside the desired frequency band.

2. The frequency translated notch filter of claim 1, wherein the capacitor is further implemented using a fringe capacitor.

3. The frequency translated filter of claim 2, wherein the MOS capacitor is at least partially formed in a semiconductor substrate.

4. The frequency translated notch filter of claim 3, wherein the fringe capacitor is formed above the MOS capacitor on the semiconductor substrate.

5. The frequency translated notch filter of claim 4, wherein the fringe capacitor and the MOS capacitor form a unit capacitor.

6. The frequency translated notch filter of claim 5, wherein the unit capacitor is replicated to produce a plurality of unit capacitors, the unit capacitors being coupled in parallel to form the capacitor.

7. The frequency translated notch filter of claim 2, wherein the fringe capacitor comprises interdigitated metal fingers.

8. The frequency translated notch filter of claim 2, wherein the fringe capacitor is formed from a plurality of metal layers.

9. The frequency translated notch filter of claim 2, wherein a first plate of the fringe capacitor is coupled to a gate of the MOS capacitor, and wherein a second plate of the fringe capacitor is coupled a gate of an additional MOS capacitor.

10. The frequency translated notch filter of claim 1, wherein the passive mixer comprises a single-balanced mixer configured to mix the LO signal and the RF signal and provide a frequency converted RF signal at the mixer output.

11. The frequency translated notch filter of claim 1, wherein the passive mixer comprises a double-balanced mixer configured to mix the LO signal and the RF signal and provide a frequency converted RF signal at the mixer output.

12. The frequency translated filter of claim 1, wherein an impedance seen by the RF signal at the first mixer input is substantially equal to the baseband impedance translated in frequency by a frequency of the LO signal.

13. A frequency translated notch filter configured to filter frequency components of an radio frequency (RF) signal outside a desired frequency band to provide a filtered RF signal, the frequency translated filter comprising:
   a passive mixer configured to mix the RF signal received at a first mixer input and a local oscillator (LO) signal received at a second mixer input; and
   a baseband impedance coupled between an output of the passive mixer and ground, the baseband impedance comprising a capacitor implemented using a metal-oxide semiconductor (MOS) capacitor,
   wherein a drain to gate voltage of the MOS capacitor is biased to provide a substantially constant capacitance over changes in the RF signal,
   wherein the filtered RF signal is taken as an output at the first mixer input.

14. The frequency translated notch filter of claim 13, wherein the capacitor is further implemented using a fringe capacitor.

15. The frequency translated filter of claim 14, wherein the MOS capacitor is at least partially formed in a semiconductor substrate.

16. The frequency translated notch filter of claim 15, wherein the fringe capacitor is formed above the MOS capacitor on the semiconductor substrate.

17. The frequency translated notch filter of claim 14, wherein the fringe capacitor comprises interdigitated metal fingers.

18. The frequency translated notch filter of claim 14, wherein the fringe capacitor is formed from a plurality of metal layers.

19. The frequency translated notch filter of claim 14, wherein a first plate of the fringe capacitor is coupled to a gate of the MOS capacitor, and wherein a second plate of the fringe capacitor is coupled a gate of an additional MOS capacitor.

20. The frequency translated notch filter of claim 13, wherein the passive mixer comprises a single-balanced mixer configured to mix the LO signal and the RF signal and provide a frequency converted RF signal at the mixer output.

21. The frequency translated notch filter of claim 13, wherein the passive mixer comprises a double-balanced mixer configured to mix the LO signal and the RF signal and provide a frequency converted RF signal at the mixer output.

22. The frequency translated notch filter of claim 13, wherein an impedance seen by the RF signal at the first mixer input is substantially equal to the baseband impedance translated in frequency by a frequency of the LO signal.

23. The frequency translated notch filter of claim 13, wherein the first mixer input presents a high-impedance path to ground for frequency components of the RF signal within the frequency band of interest and a low-impedance path to ground for frequency components of the RF signal outside the frequency band of interest.

24. A radio frequency (RF) receiver, comprising:
   an integrated circuit pin configured to couple an RF signal to an RF signal path; and
   a frequency translated notch filter coupled to the RF signal path and configured to translate a baseband impedance to a higher frequency, the translated baseband impedance configured to provide a high-impedance path to ground for frequency components of the RF signal within a frequency band of interest and a low-impedance path to ground for frequency components of the RF signal outside the frequency band of interest,
   wherein the baseband impedance comprises a capacitor implemented using a metal-oxide semiconductor (MOS) capacitor,
   wherein a drain to gate voltage of the MOS capacitor is biased to provide a substantially constant capacitance over changes in the RF signal.

25. The RF receiver of claim 24, wherein the capacitor is further implemented using a fringe capacitor.

26. The RF receiver of claim 25, wherein the MOS capacitor is at least partially formed in a semiconductor substrate.

27. The RF receiver of claim 26, wherein the fringe capacitor is formed above the MOS capacitor on the semiconductor substrate.

28. The RF receiver of claim 25, wherein the fringe capacitor comprises interdigitated metal fingers.

29. The RF receiver of claim 25, wherein the fringe capacitor is formed from a plurality of metal layers.

30. The RF receiver of claim 25, wherein a first plate of the fringe capacitor is coupled to a gate of the MOS capacitor, and wherein a second plate of the fringe capacitor is coupled a gate of an additional MOS capacitor.

31. The RF receiver of claim 24, further comprising:
   a low noise amplifier (LNA) coupled to the RF signal path and configured to provide an amplified version of the RF signal at an output.

* * * * *

UNITED STATES PATENT AND TRADEMARK OFFICE
CERTIFICATE OF CORRECTION

PATENT NO. : 8,238,862 B2  Page 1 of 1
APPLICATION NO. : 12/497317
DATED : August 7, 2012
INVENTOR(S) : Ahmad Mirzaei It is certified that error appears in the above-identified patent and that said Letters Patent is hereby corrected as shown below:

Column 17, Line 18, replace "coupled a gate" with --coupled to a gate--.

Column 18, Line 4, replace "coupled a gate" with --coupled to a gate--.

Column 18, Lines 54-55, replace "coupled a gate" with --coupled to a gate--.

Signed and Sealed this
Second Day of October, 2012

David J. Kappos
*Director of the United States Patent and Trademark Office*